(12) United States Patent
Sato et al.

(10) Patent No.: US 10,023,950 B2
(45) Date of Patent: Jul. 17, 2018

(54) VAPOR DEPOSITION MASK AND ORGANIC EL DISPLAY DEVICE

(71) Applicant: Japan Display Inc., Tokyo (JP)

(72) Inventors: Toshihiro Sato, Tokyo (JP); Takeshi Ookawara, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/512,107

(22) PCT Filed: Oct. 5, 2015

(86) PCT No.: PCT/JP2015/078237
§ 371 (c)(1),
(2) Date: Mar. 17, 2017

(87) PCT Pub. No.: WO2016/056515
PCT Pub. Date: Apr. 14, 2016

(65) Prior Publication Data
US 2017/0275749 A1    Sep. 28, 2017

(30) Foreign Application Priority Data

Oct. 6, 2014  (JP) ................ 2014-205457

(51) Int. Cl.
*C23C 14/04* (2006.01)
*H01L 51/50* (2006.01)
(Continued)

(52) U.S. Cl.
CPC ........ *C23C 14/042* (2013.01); *H01L 21/0332* (2013.01); *H01L 21/0334* (2013.01);
(Continued)

(58) Field of Classification Search
CPC .......... C23C 8/04; C23C 10/04; C23C 14/04; C23C 14/042; C23C 14/044;
(Continued)

(56) References Cited

U.S. PATENT DOCUMENTS

2014/0199808 A1    7/2014   Sugimoto et al.

FOREIGN PATENT DOCUMENTS

| JP | 2013-209710 A | 10/2013 |
|---|---|---|
| JP | 2013-245392 A | 12/2013 |
| JP | 2014-67500 A  | 4/2014  |

OTHER PUBLICATIONS

International Search Report dated Jan. 12, 2016 for PCT Application No. PCT/JP2015/078237 with partial translation.
(Continued)

*Primary Examiner* — Sonya D McCall Shepard
(74) *Attorney, Agent, or Firm* — Typha IP LLC

(57) ABSTRACT

The purpose is providing a vapor deposition mask with high rigidity which can evaporate a uniform thickness film. A vapor deposition mask including a mask body having a main opening, a side surface of the main opening, an upper surface intersecting the side surface, and a lower surface opposing the upper surface, a first insulator contacting the lower surface, and a second insulator contacting the upper and side surfaces, wherein the first insulator includes a first region inside the main opening, and a first opening in the first region, the second insulator includes a second region inside the main opening, and a second opening in the second region, the mask body is sandwiched between the first and second insulators, and one of the first and second insulators includes a region located inside the main opening more centrally than the other and not overlapping with the other and the mask body.

15 Claims, 19 Drawing Sheets

(51) Int. Cl.
  *H01L 21/033* (2006.01)
  *H01L 21/308* (2006.01)
  *H01L 21/027* (2006.01)
  *C23C 8/04* (2006.01)

(52) U.S. Cl.
  CPC ...... *H01L 21/3086* (2013.01); *H01L 51/5012* (2013.01); *C23C 8/04* (2013.01); *H01L 21/0275* (2013.01)

(58) Field of Classification Search
  CPC ..... C23C 14/046; C23C 14/048; C23C 16/04; C23C 16/042; C23C 16/045; C23C 16/047; C23C 18/06; C23C 18/1603; C23C 18/1605; C23C 18/1607; C30B 25/04; H01J 29/073; H01J 29/076; H01J 31/08; H01J 31/20; H01J 37/32651; H01J 2229/07; H01J 2229/075; H01J 2229/0755; H01J 2229/0777; H01L 21/02642; H01L 21/02678; H01L 21/0268; H01L 21/027; H01L 21/0332; H01L 21/0334; H01L 21/0337; H01L 21/0338; H01L 21/0465; H01L 21/0335; H01L 21/266; H01L 21/28141; H01L 21/2815; H01L 21/308; H01L 21/3081; H01L 21/3083; H01L 21/3085; H01L 21/3086; H01L 21/3088; H01L 21/31; H01L 21/31144; H01L 21/32; H01L 21/32139; H01L 21/426; H01L 21/467; H01L 21/469; H01L 21/475; H01L 21/67718; H01L 2224/11906; H01L 2224/11903; H01L 2224/11902; H01L 2224/11622; H01L 2224/1162; H01L 2224/1148; H01L 2224/11474; H01L 2224/1147; H01L 2224/03916; H01L 2224/03914; H01L 2224/03912; H01L 2224/03906; H01L 2224/03903; H01L 2224/03902; H01L 2224/03622; H01L 27/3295; H01L 27/3283; H01L 21/7688; H01L 21/7681; H01L 21/68764; H01L 21/68
  See application file for complete search history.

(56) References Cited

OTHER PUBLICATIONS

Written Opinion dated Jan. 12, 2016 for PCT Application No. PCT/JP2015/078237.
Written Opinion of ISA dated Jan. 12, 2016, for PCT Application No. PCT/JP2015/078237.

VAPOR DEPOSITION MASK AND ORGANIC EL DISPLAY DEVICE

TECHNICAL FIELD

The present invention relates to a vapor deposition mask for forming a pattern formed by a thin film above a substrate. In particular, the present invention relates to a vapor deposition mask for depositing an organic material used in a light emitting element such as an electroluminescence element, and an organic EL display device formed using the same.

BACKGROUND

Organic electroluminescence (hereinafter also referred to as "EL") elements are known as light emitting elements which utilize an electroluminescence (EL) phenomenon. An organic EL element can emit light at colors of various wavelengths by selecting organic materials which form functional layers such as a light emitting layer, an electron injection layer and a hole injection layer, and applications for display devices and lighting equipment is progressing.

Both a low molecular organic material or high molecular organic material can be used as an organic material forming the functional layers described above. In particular, since a low molecular organic material has excellent thermal stability and is easy to handle, practical use as an organic material forming a functional layer of an organic EL device is already progressing.

Currently, vapor deposition of a deposition mask is mainly used as a method of forming an organic material forming each functional layer in an organic EL display device. A vapor deposition mask is a mask (shielding plate) formed by a metal foil (metal sheet) in which a plurality of fine slits or holes (hereinafter referred to as "opening parts") are arranged at minute intervals, and is called a metal mask. For example, in the case of manufacturing an active matrix type organic EL display device, a vapor deposition mask in which a plurality of opening parts are arranged corresponding to the arrangement of a plurality of pixels (that is, regions where an organic material is formed) is used.

Normally, a vapor mask is fixed by welding or laser welding in a state where tension is applied to a strong rectangular frame. In addition, at the time of vapor deposition, a method of placing a vapor deposition mask on a substrate which is the object of vapor deposition in a state fixed to a frame and fixing and holding the vapor deposition mask from a rear surface of the substrate using a magnet or the like is generally adopted.

However, since the rigidity of a vapor deposition mask is extremely small, slight distortions may occur when the mask is held on the substrate surface, which may become a problem particularly in the manufacture of a high definition organic EL display device. In addition, the generation of metal foreign objects due to the contact between a vapor deposition mask formed by metal foil and the substrate surface has been regarded as a problem.

In view of the problem of rigidity described above, a method is proposed in Patent Document 1 and Patent Document 2 in which a resin such as polyimide is coated on a metal member forming a vapor deposition mask to form smaller opening parts in the resin located in the opening parts of the metal member. The effect of increasing rigidity by reinforcing a vapor deposition mask with resin was aimed for.

PRIOR ART

Patent Document

Patent Document 1: Japanese Unexamined Patent Publication No. 2013-209710
Patent Document 2: Japanese Unexamined Patent Publication No. 2013-245392

SUMMARY OF THE INVENTION

Problem to be Solved by the Invention

However, in the vapor deposition masks described in Patent Document 1 and Patent Document 2, since a cross-sectional shape of an opening part arranged in a resin has a reverse taper or perpendicular shape, there is a problem by which an incident component from a diagonal direction of the vapor deposition material is blocked by an end part of the opening part which affects a film thickness distribution of an organic material.

FIG. 19 is a diagram showing a vapor deposition method using a conventional deposition mask described in Patent Document 1 and Patent Document 2. In FIG. 19(A), 1901 is a substrate to be processed, 1902 is a resin layer and 1903 is a mask body formed by a conductor such as a magnetic metal. As is shown in FIG. 19(A), an organic material which is a vapor deposition material enters from above the mask body 1903. Actually, the organic material enters from various directions including a diagonal direction.

FIG. 19(B) is a diagram showing a film thickness distribution in the case where an opening part 1904 arranged in the resin layer 1902 is viewed from a direction perpendicular to a surface of the substrate 1901. At this time, since the organic material uniformly enters near the center of the opening part 1904, an organic film 1905 is formed with a desired film thickness. However, in the vicinity of an end part of the opening part 1904, an edge (edge) of the opening part becomes a shadow, variation occurs in the film thickness distribution and an organic film 1906 having a thin film thickness is locally formed.

As described above, in the vapor deposition methods described in Patent Document 1 and Patent Document 2, it was difficult to form an organic film having a uniform film thickness without being affected by the opening parts. In order to solve this problem, although reducing the film thickness of a resin layer is conceivable, a problem occurs in which the strength of the vapor deposition mask is insufficient. In addition, a problem in which generation of foreign objects due to contact between the substrate to be processed described above and a conductor forming the vapor deposition mask could not be solved.

The present invention is a result of attempting to solve the problems described above and aims to provide a vapor deposition mask by which vapor deposition at a uniform film thickness while maintaining high rigidity of the entire vapor deposition mask is possible.

In addition, another aim of the present invention is to provide a vapor deposition mask by which a reduction in the generation of foreign objects in the case when the vapor deposition mask and a substrate to be processed are in contact with each other is possible.

Means for Solving the Problem

A vapor deposition mask in one aspect of the present invention includes a mask body having a main opening part, a side surface of the main opening part, an upper surface intersecting with the side surface, and a lower surface intersecting with the side surface and opposing the upper surface; a first insulator contacting the lower surface, and a second insulator contacting the upper surface and the side surface, wherein the first insulator includes a first region located inside of the main opening part, and a first opening part located in the first region, the second insulator includes a second region located inside of the main opening part, and a second opening part located in the second region, the mask body is sandwiched between the first insulator and the second insulator, and one of the first insulator and the second insulator includes a region located inside of the main opening part more centrally than an other and not overlapping with the other and the mask body.

A vapor deposition mask in one aspect of the present invention includes a mask body having a main opening part, a side surface of the main opening part, an upper surface intersecting with the side surface, and a lower surface intersecting with the side surface and opposing the upper surface, a first insulator contacting the lower surface, a second insulator contacting the upper surface and the side surface, and a third insulator contacting the second insulator and opposing the upper surface and the side surface via the second insulator, wherein the first insulator includes a first region located inside of the main opening part, and a first opening part located in the first region, the second insulator includes a second region located inside of the main opening part, and a second opening part located in the second region, the third insulator includes a third region located inside of the main opening part, and a third opening part located in the third region, the mask body is sandwiched between the first insulator and the second insulator, and the third insulator includes a region located inside of the main opening part more centrally than the first insulator and the second insulator and not overlapping with the first insulator, the second insulator and the mask body.

A manufacturing method of a vapor deposition mask arranged with a plurality of vapor deposition holes arranged regularly in one aspect of the present invention includes a step of forming a first insulator above a substrate, a step of arranging a mask body including a plurality of opening parts above the first insulator, a step of forming an opening part of the first insulator inside of an opening part of the mask body, a step of forming a second insulator covering the mask body and the first insulator, a step of forming an opening part of the second insulator inside of an opening part of the first insulator, and a step of removing the substrate.

A manufacturing method of a vapor deposition mask arranged with a plurality of vapor deposition holes arranged regularly in one aspect of the present invention includes a step of forming a first insulator above a substrate, a step of arranging a mask body including a plurality of opening parts above the first insulator, a step of forming an opening part of the first insulator inside of an opening part of the mask body, a step of forming a second insulator covering the mask body and the first insulator, a step of forming an opening part of the second insulator which is an inner side of an opening part of the mask body so that an opening part of the first insulator is arranged inside on an inner side of the opening of the second insulator, and a step of removing the substrate.

A manufacturing method of a vapor deposition mask arranged with a plurality of vapor deposition holes arranged regularly in one aspect of the present invention includes a step of forming a first insulator above a substrate, a step of arranging a mask body including a plurality of opening parts above the first insulator, a step of forming a second insulator covering the mask body and the first insulator, a step of forming an opening part of the first insulator and an opening part of the second insulator inside of an opening part of the mask body, a step of forming a third insulator covering the first insulator, a step of forming an opening part of the third insulator inside of an opening part of the second insulator and an opening part of the first insulator respectively, and a step of removing the substrate.

EMBODIMENTS OF THE INVENTION

Each embodiment of the present invention is explained below while referring to the diagrams. However, it is possible to perform the present invention using various different forms within a scope that does not depart from the concept of the present invention, and the present invention should not be limited to the content described in the embodiments exemplified herein. In addition, in the diagrams, the width, thickness and shape of each component may be represented schematically compared to their actual form in order to better clarify explanation. These schematic diagrams are merely an example and should not limit an interpretation of the present invention. In addition, in the specification and each diagram, the same reference symbols are attached to similar elements and elements that have been mentioned in previous diagrams, and therefore a detailed explanation may be omitted.

First Embodiment

<Schematic Structure of a Vapor Deposition Mask>

Figure 1:
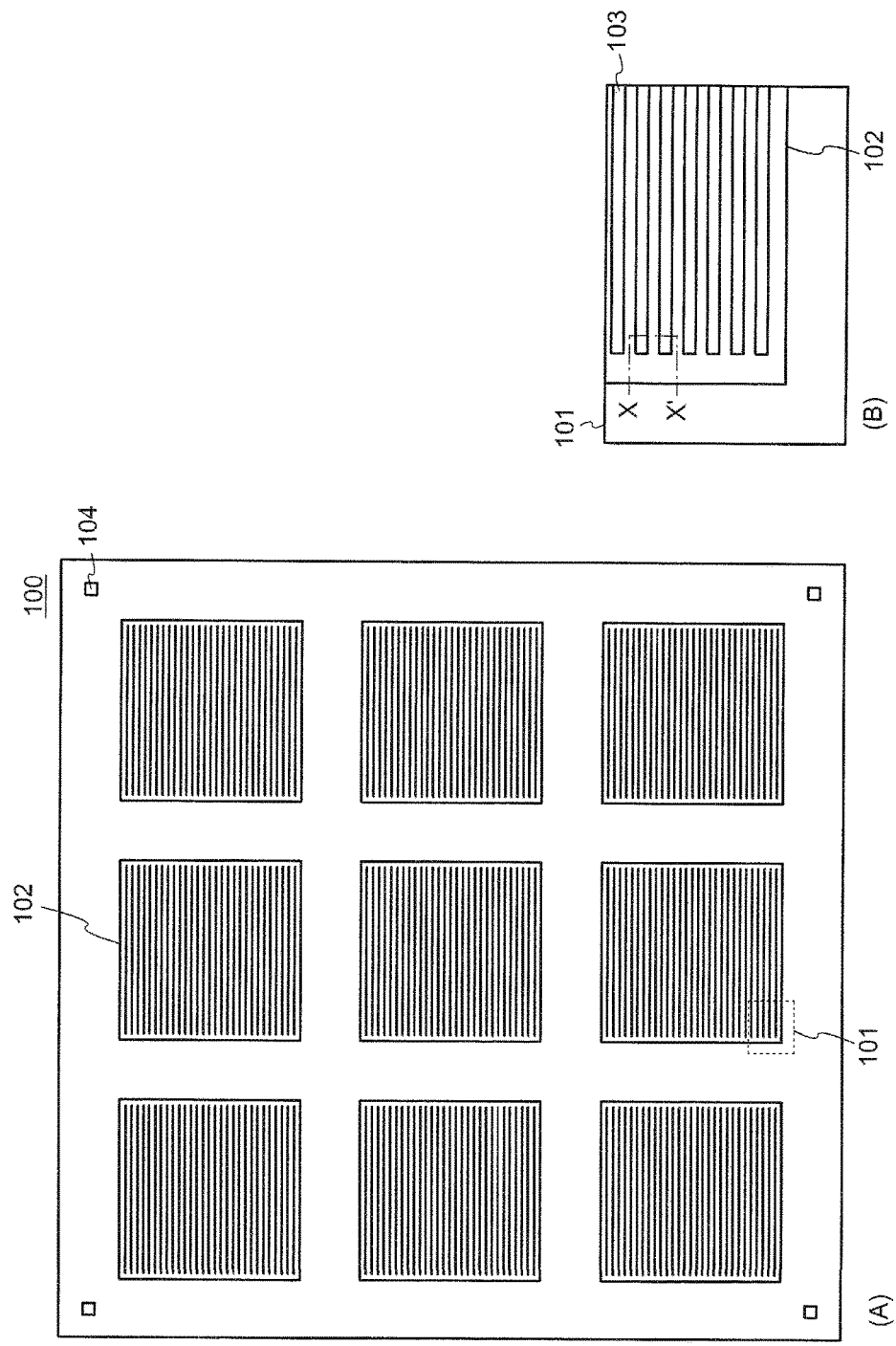
FIG. 1 is a planar view diagram showing a schematic structure of a vapor deposition mask according to a first embodiment of the present invention.

FIG. 1 shows a schematic structure of a vapor deposition mask 100 according to a first embodiment of the present invention. FIG. 1(A) is a planar view of the vapor deposition mask 100. FIG. 1(B) is an enlarged view with an enlarged frame part shown by 101 in FIG. 1(A).

The vapor deposition mask 100 of the first embodiment has a structure in which a mask body formed by a conductor is covered with an insulator such as a resin and is arranged with a plurality of vapor deposition regions 102. A metal having a thickness of 30 to 200 μm formed by a magnetic metal such as nickel, a nickel alloy, invar or the like can be used as the conductor. The vapor deposition region 102 is arranged corresponding to a display region of the organic EL display device, for example.

Therefore, when manufacturing a plurality of organic EL display devices on a glass substrate, it is possible to collectively form a thin film using an organic material corresponding to each display region of a plurality of electroluminescent display devices by using the vapor deposition mask 100 of the present embodiment. Naturally, the number of vapor deposition regions 102 can be set to an arbitrary number.

As is shown in FIG. 1(B), a plurality of vapor deposition holes 103 are formed in each vapor deposition region 102. In the present embodiment, although an example is shown in which slits are formed as the vapor deposition holes 103, it is also possible to arrange not only slits but also opening parts of any shape such as a circle or rectangle and the like according to a pixel arrangement of the organic EL display device.

Alignment marks 104 are arranged at the four corners of the vapor deposition mask 100. This is a marker on the mask side used for alignment between a substrate which is the object of vapor deposition and the vapor deposition mask 100. These may be arranged in the vicinity of a central part of each side.

Figure 2:
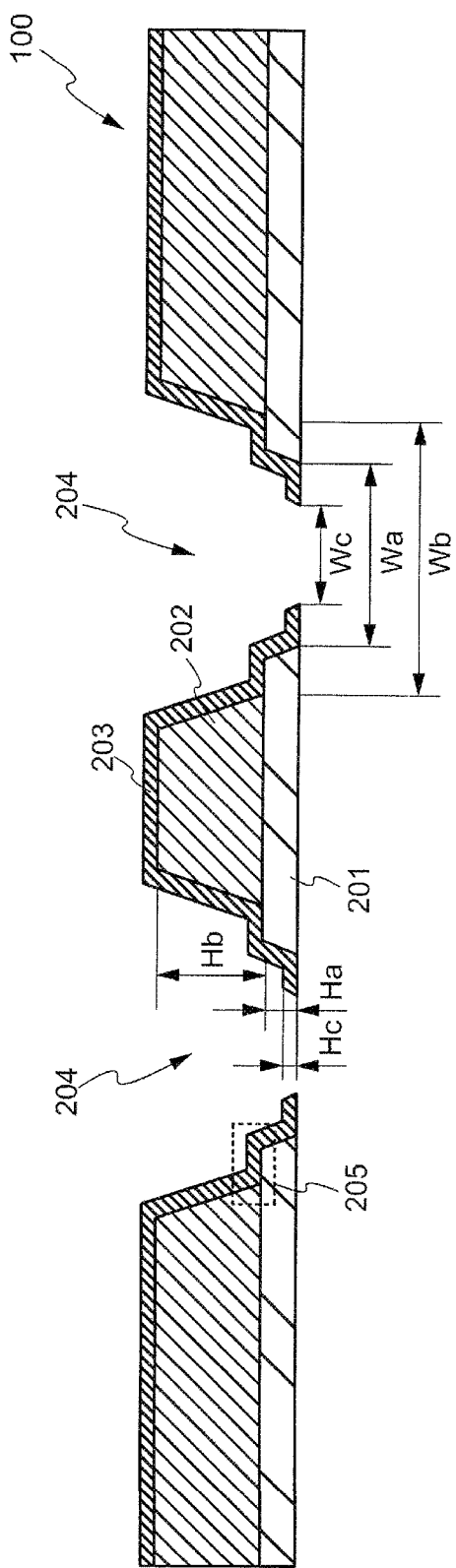
FIG. 2 is a cross-sectional diagram showing a schematic structure of a vapor deposition mask according to a first embodiment of the present invention.
Figure 3:
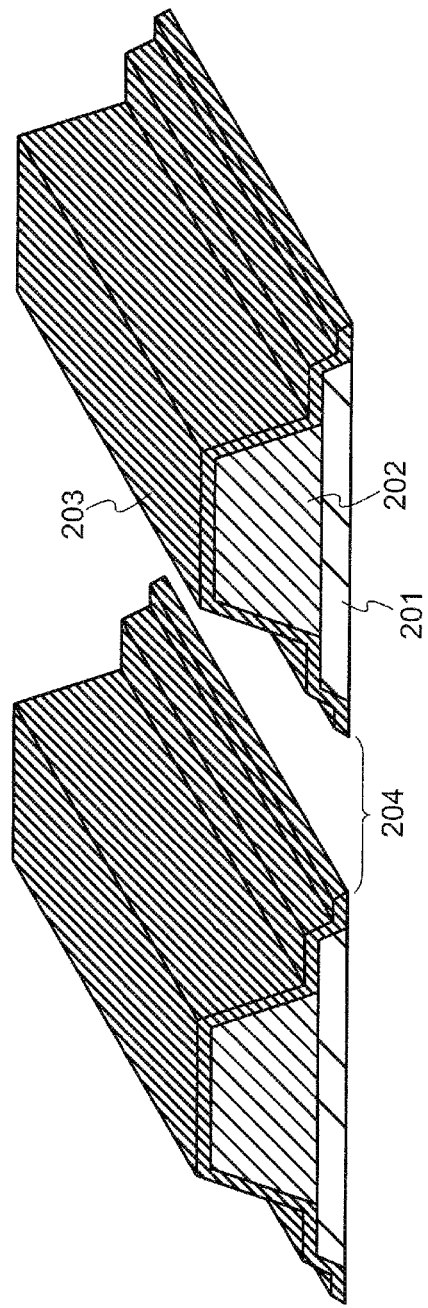
FIG. 3 is a perspective view diagram showing a schematic structure of a vapor deposition mask according to a first embodiment of the present invention.

Here, FIG. 2 shows a cross-sectional view taken along the line X-X of the vapor deposition region 102 in FIG. 1(B). In addition, a perspective view centered on a slit part is shown in FIG. 3. In FIG. 2, although it appears that the mask body is separated into three parts, actually the three parts are all physically connected as shown in FIG. 1(B).

In FIG. 2, 201 is a first insulator, 202 is a mask body (for example, a mask material formed by a conductor), and 203 is a second insulator. The mask body 202 is a part serving as a basic skeleton of the vapor deposition mask 100 shown in FIG. 1, and is typically formed by a magnetic metal such as nickel, a nickel alloy, invar or the like. In the present embodiment, a metal foil (metal sheet) arranged with a small thermal expansion coefficient and invar characteristics which is difficult to be affected by heat is used as the mask body 202.

In addition, in the present embodiment, a cross-section of the mask body 202 is a trapezoid. This is because an inner wall of the vapor deposition hole 204 (corresponding to the vapor deposition hole 103 in FIG. 1) in the deposition mask 100 has a taper shape. However, the shape of the mask body 202 is not limited to a trapezoid, and a side surface of a trapezoid part forming the mask body in FIG. 2 may also be a concave shape. In other words, the mask body 202 is not particularly limited to a specific shape as long as the side surface of the mask body 202 includes an incline.

It is possible to use an organic film formed by a resin such as polyimide, epoxy, acrylic or polyethylene terephthalate (PET) as the first insulator 201 and second insulator 203. An inorganic film such as silicon nitride or silicon oxide may also be used. In addition, these organic films and inorganic films may be arbitrarily combined and used. That is, it may also contain silicon nitride or silicon oxide. For example, it is possible to form the first insulator 201 and second insulator 203 using the same type of organic film, and it is possible to form the first insulator 201 using an organic film and the second insulator 203 using an inorganic film.

A feature of the vapor deposition mask 100 of the present embodiment is that the mask body 202 formed by a magnetic metal is covered by two insulators, the first insulator 201 and second insulator 203. In this way, it is possible to realize a vapor deposition mask including fine vapor deposition holes (slit shape or rectangular shape) while maintaining overall strength (rigidity).

In addition, since an inner wall of a vapor deposition hole of the vapor deposition mask 100 has a step shape and a substantially taper shape, a shadow is hardly formed on a vapor deposition material entering from various angles, and it is possible to form a uniform vapor deposition film with few film thickness distributions.

Furthermore, even if a substrate which is the object of vapor deposition and the deposition mask 100 are in contact, the mask body 202 does not come into direct contact with the substrate which is the object of vapor deposition. Therefore, no foreign objects (for example, metallic foreign objects) are generated due to contact between the two, and a high yield and highly reliable vapor deposition can be performed.

Here, when a film thickness of the first insulator 201 is Ha (typically 5 to 20 μm), a thickness of the mask body 202 is Hb (typically 10 to 50 μm), and a film thickness of the second insulator 203 is Hc (typically 1 to 5 μm), it is preferred that the relationship Hc≤Ha is established between the film thickness (Ha) of the first insulator 201 and the film thickness (Hc) of the second insulator 203. For example, in the vapor deposition mask 100 of the present embodiment, the film thickness (Ha) of the first insulator 201 is 10 μm, the film thickness (Hb) of the mask body 202 is 30 μm, and the film thickness (Hc) of the second insulator 203 is 5 μm.

Figure 19:
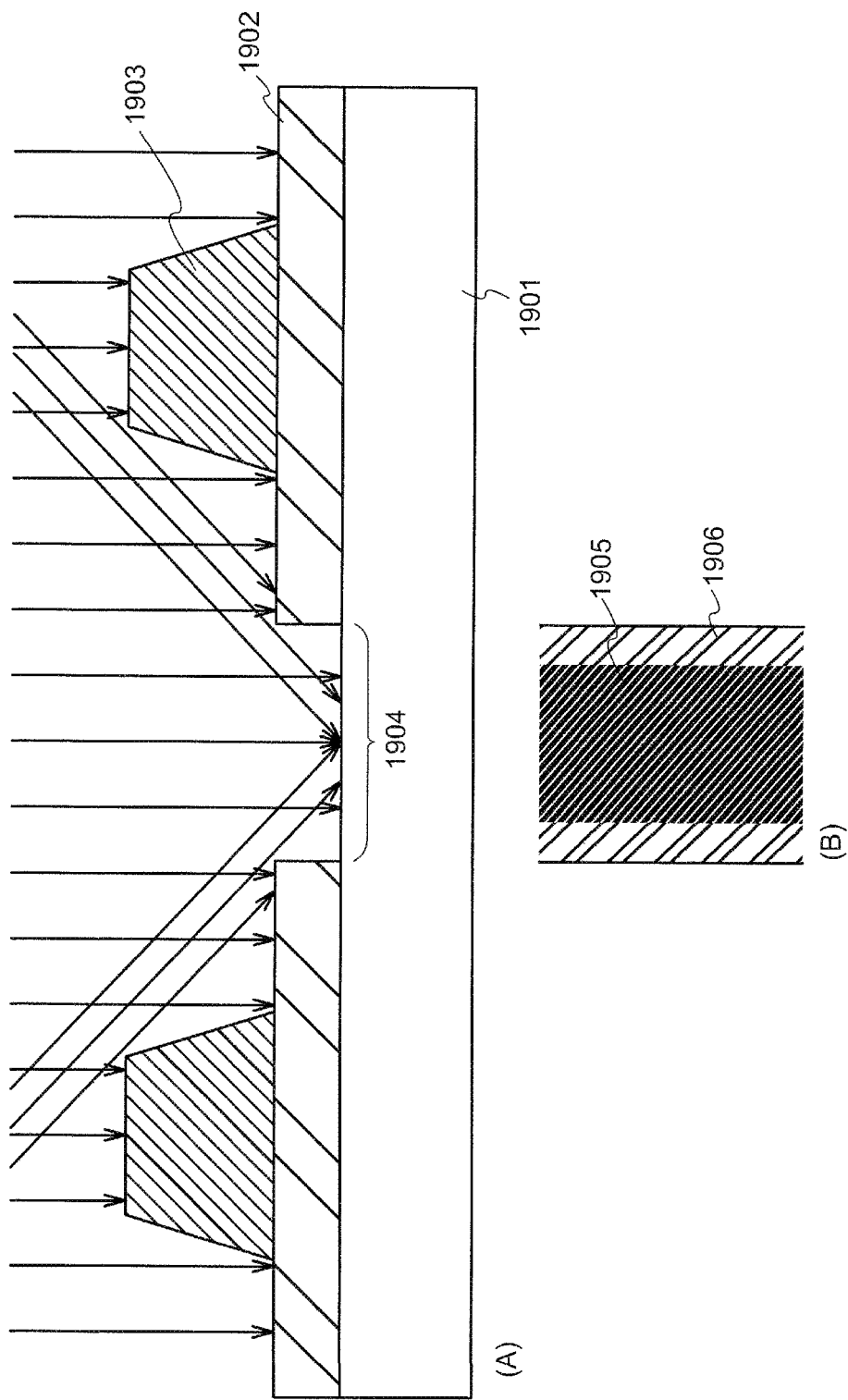
FIG. 19 is a diagram showing the problems in a conventional vapor deposition mask.

In this way, a structure is formed in which an inner wall of the vapor deposition hole 204 is covered by the second insulator 203, and only the second insulator 203 with a film thickness (Hc) of about 1 to 5 μm is arranged at the bottom part of the vapor deposition hole 204. Therefore, as is shown in FIG. 19(A), a shadow is not formed on a vapor deposition material (typically, organic material) at an opening end part. Therefore, it is possible to prevent a variation in a film thickness distribution of a vapor deposition film as explained using FIG. 19(B).

In addition, it is possible to reinforce the rigidity of the mask body 202 and increase the overall rigidity of the vapor deposition mask 100 by setting the film thickness (Ha) of the first insulator 201 to 10 to 20 µm. Also in this case, by setting the film thickness (Hc) of the second insulator 203 to 3 to 5 µm, since no shadow is formed on the vapor deposition material at the bottom part of the vapor deposition hole, it is possible to prevent variation in a film thickness distribution of a vapor deposition film.

Furthermore, when a width (typically 25 to 45 µm) of a first opening part (slit) formed in the first insulator 201 is Wa, a width (typically 30 to 50 µm) of a main opening part formed in the mask body 202 is Wb, and a width (typically 20 to 40 µm) of a second opening part formed in the second insulator 203 is Wc, it is preferred that the relationship Wc≤Wa≤Wb is established between the widths of these opening parts.

For example, in the vapor deposition mask 100 of the present embodiment, the width (Wa) of the first opening part formed in the first insulator 201 is 35 µm, the width (Wb) of the main opening part formed in the mask body 202 is 40 µm, and the width (Wc) of the second opening part formed in the second insulator 203 is 30 µm. In the present embodiment, a pitch of the vapor deposition holes 204 is set to 60 µm, however, it is not limited to this value.

In FIG. 2, the width (Wc) of the second opening part formed in the second insulator 203 corresponds to the width (slit width) of the vapor deposition hole 103 shown in FIG. 1(B). That is, in the vapor deposition mask 100 of the present embodiment, the width (Wc) of the second opening part formed in the second insulator 203 substantially determines an opening width of the vapor deposition hole 204 in the vapor deposition mask 100.

With such a structure, as is shown in FIG. 2, the first opening part of the first insulator 201 is located inside of the main opening part formed in the mask body 202, and the second opening part of the second insulator 203 is located further to the inside. That is, a structure is formed in which a step shaped (substantially taper shaped) step is formed on an inner wall of the vapor deposition hole 204, and a vapor deposition material entering from various angles enters easily.

That is, the vapor deposition mask 100 shown in FIG. 2 is arranged with the mask body 202 including a main opening part, a side surface of the main opening part, an upper surface intersecting the side surface, and a lower surface intersecting the side surface and opposing the upper surface. Furthermore, the first insulator 201 is arranged in contact with the lower surface and the second insulator 203 is arranged in contact with the upper surface and the side surface. The first insulator 201 includes a first region located inside of the main opening part and a first opening part located in the first region. The second insulator 203 includes a second region located inside of the main opening part and a second opening part located in the second region. The mask body 202 is sandwiched between the first insulator 201 and the second insulator 203. One of the first insulator 201 and the second insulator 203 (the second insulator 203 in FIG. 2) is located further to the inside of the main opening part than the other (the first insulator 201 in FIG. 2) and does not overlap the other and the mask body 202.

In addition, a film thickness of the second insulator 203 is thinner than a film thickness of the first insulator 201. Furthermore, in the vapor deposition mask 100 shown in FIG. 2, the second insulator 203 is located further to the inside of the main opening part than the first insulator 201. In addition, the second opening part of the second insulator 203 is located further to the inside than the first opening part of the first insulator 201. In addition, the second region located at an end of the second opening does not overlap with the first insulator 201 and the mask body 202.

Furthermore, in the vapor deposition mask 100 shown in FIG. 2, the first region includes a part which does not overlap with the second insulator 203 and the mask body 202, and a step is formed inside of the main opening part by this part and the second region.

In the structure of the present embodiment described above, the first insulator 201 located under the mask body 202 includes a predetermined film thickness and can maintain the strength of the vapor deposition mask 100. In addition, the second insulator 203 which is thinner than the first insulator 201 is located on the innermost side of the vapor deposition hole 204 of the vapor deposition mask 100. That is, the thickness of the end part of the vapor deposition hole 204 can be reduced. In this way, incidence of a vapor deposition material can be reduced by the end part of the vapor deposition hole 204. Consequently, variation in a film thickness distribution shown in FIG. 19(A) and FIG. 19(B) can be suppressed. This effect is more prominent as the vapor deposition hole 204 becomes smaller due to high definition. Therefore, the structure of the present embodiment has the effect of being able to make the film thickness of a film to be deposited uniform without reducing the strength of a vapor deposition mask.

In addition, since the first opening part of the first insulator 201 is located inside of the main opening part formed in the mask body 202, the first insulator 201 and the second insulator 203 are formed so as to face each other as is shown by the frame line 205. In this way, the mask body 202 is sandwiched using the first insulator 201 and the second insulator 203 and the mask body 202 can be completely covered. As a result, even when the substrate which is the object of vapor deposition and the vapor deposition mask 100 are brought into contact, it is possible to prevent the generation of foreign objects due to contact between the two.

Furthermore, since the second insulator 203 is in contact with the first insulator 201 at a surface, the generation of defects due to film peeling of the first insulator 201 is also reduced and durability of a vapor deposition mask can be improved.

<Manufacturing Method of a Vapor Deposition Mask>

Figure 4:
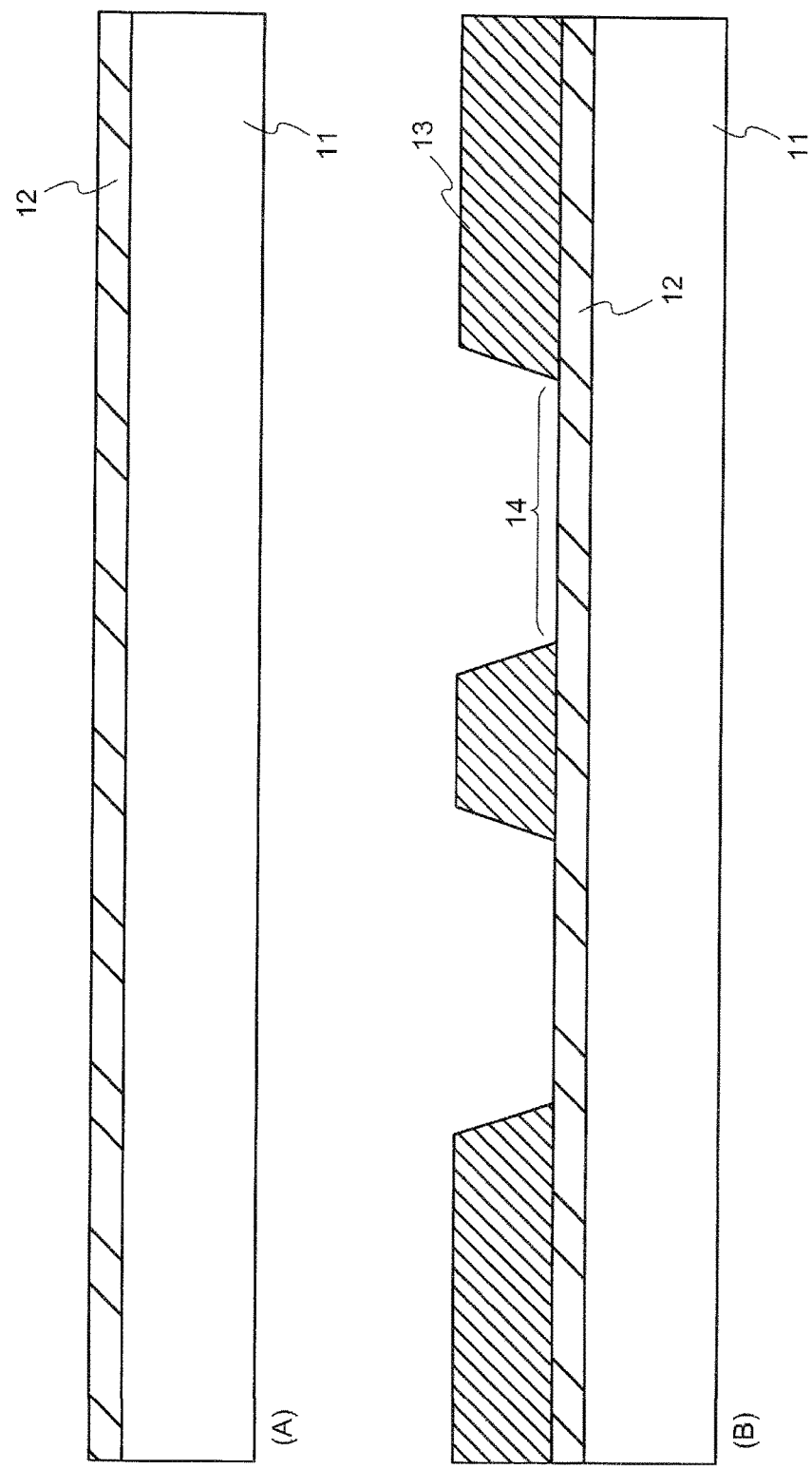
FIG. 4 is a diagram showing a manufacturing method of a vapor deposition mask according to a first embodiment of the present invention.
Figure 5:
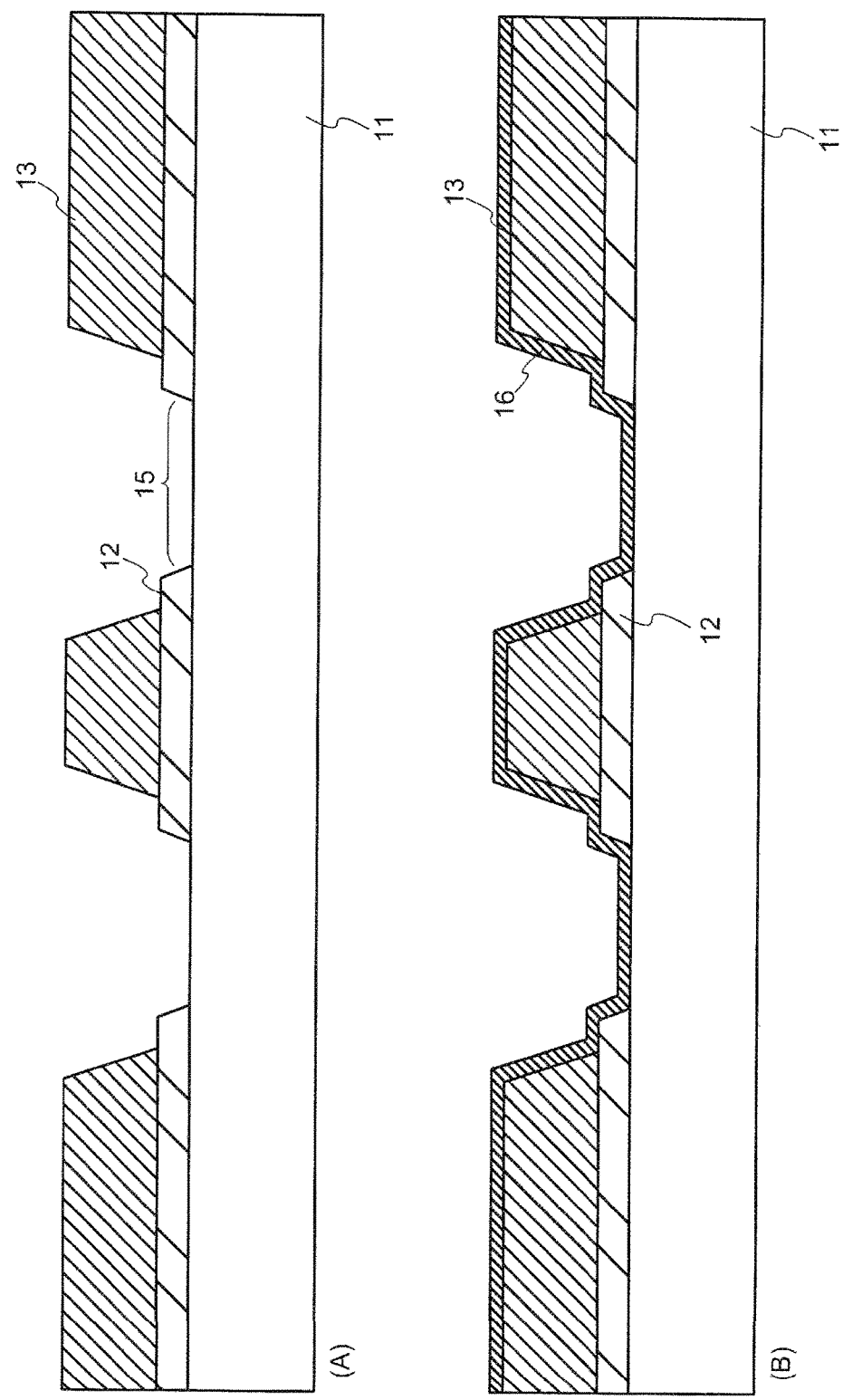
FIG. 5 is a diagram showing a manufacturing method of a vapor deposition mask according to a first embodiment of the present invention.
Figure 6:
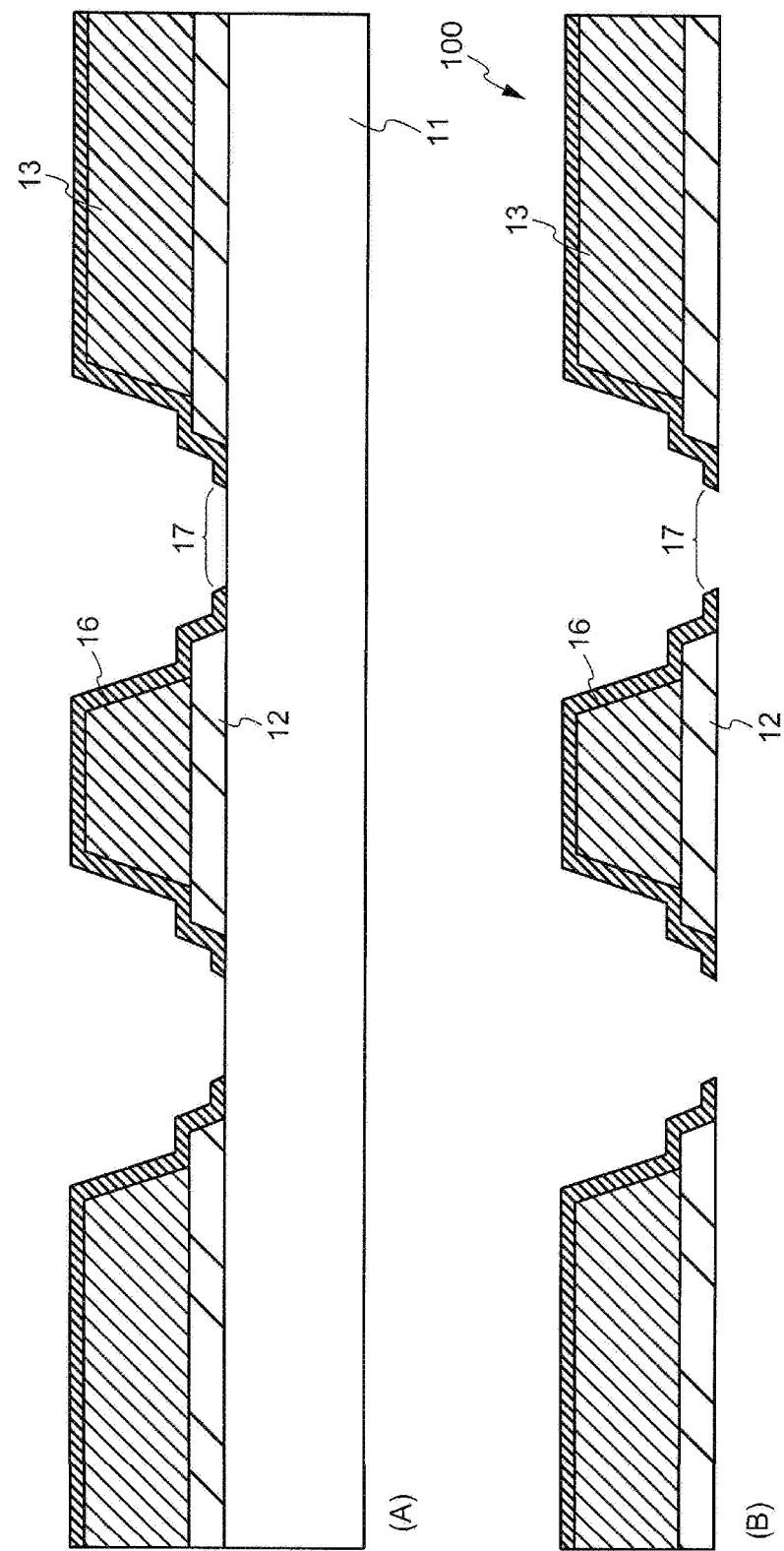
FIG. 6 is a diagram showing a manufacturing method of a vapor deposition mask according to a first embodiment of the present invention.

FIG. 4 to FIG. 6 show a manufacturing method of the vapor deposition mask 100 according to the first embodiment of the present invention. In FIG. 4(A), a resin film formed from polyimide is formed as a first insulator 12 on a support substrate 11. The first insulator 12 can be formed by coating polyimide using a known spin-coating method or printing method and then curing the polyimide by light irradiation or heating. In the vapor deposition mask 100 of the present embodiment, the film thickness (Ha) of the first insulator 12 is 10 µm.

Furthermore, a separate adhesive sheet (not shown in the diagram) may be arranged between the support substrate 11 and the first insulator 12 in order to finally peel off the first insulator 12 from the support substrate 11. For example, it is preferred to use an adhesive sheet including a property that can weaken adhesive strength by light irradiation or heating such as a known dicing tape.

In the present embodiment, a glass substrate is used as the support substrate 11. The support substrate 11 is used with the aim of supporting various thin films and mask bodies in the manufacturing process of a vapor deposition mask, and is finally removed when the vapor deposition mask 100 is completed on the supporting substrate 11. As a result, the material is not particularly limited, and any substrate may be used as long as it can support a resin film or a mask body (mask pattern) during a manufacturing process such as a metal substrate, a ceramic substrate and a plastic substrate and the like.

It is possible to use not only polyimide but also an organic film (thin film formed by an organic material) formed by a resin such as epoxy, acrylic and polyethylene terephthalate as the first insulator 12. In addition, an inorganic film (thin film formed by an inorganic material) such as silicon oxide or silicon nitride may also be used. Furthermore, a stacked film obtained by arbitrarily combining these may also be used.

In FIG. 4(B), a mask body (conductor sheet arranged with an opening part for vapor deposition) 13 which serves as a basic skeleton of a vapor deposition mask is adhered above the first insulator 12. A metal foil (metal sheet) using an invar material which is a magnetic metal is used as the mask body 13. In the vapor deposition mask 100 of the present embodiment, the thickness (Hb) of the mask body 13 is 30 µm.

In the present embodiment, the mask body 13 arranged in advance with a plurality of opening parts (slits) 14 is prepared (planar view is the same as in FIG. 1(A)), and the mask body 13 is adhered to the first insulator 12 using an adhesive. Furthermore, it is also possible to make the first insulator 12 function as an adhesive by adhering the mask body 13 before curing the first insulator 12 and then curing the first insulator 12.

In the vapor deposition mask 100 of the present embodiment, a width (Wb) of the main opening part 14 arranged in the mask body 13 is 40 µm as described above.

In addition, in the present embodiment, although an example was shown in which the mask body 13 prepared in advance is adhered, it is also possible to form a conductive film formed by a magnetic metal above the first insulator 12, and pattern the conductive film to form a mask body. For example, a nickel thin film is formed above the first insulator 12 by a known plating method using nickel as a magnetic metal. Following this, it is possible to form the mask body by patterning the nickel thin film by known photolithography. Naturally, formation of the nickel thin film is not limited to a plating method, and it may also be formed using a CVD method or sputtering method.

Next, in FIG. 5(A), the first insulator 12 is etched to form a plurality of opening parts 15. As explained using FIG. 1, since the plurality of opening parts 15 are formed in a stripe shape in the vapor deposition region 102, the first insulator 12 is also formed in a stripe shape in the vapor deposition region 102. However, the shape of the opening part 15 is not limited to a stripe shape, and an appropriate shape may be selected according to the kind of pattern arrangement in which a vapor deposition material is deposited.

In the present embodiment, the opening part 15 is formed using laser etching. Since the film thickness of the first insulator 12 is 5 to 20 µm (10 µm in the present embodiment), anisotropic etching in which etching proceeds selectively in a vertical direction is preferred. In the present embodiment, although an example using laser etching is shown, anisotropic etching may also be performed by dry etching using an etching gas.

In the vapor deposition mask 100 of the present embodiment, a width (Wa) of the opening part 15 arranged in the first insulator 12 is 35 µm as described above.

Furthermore, in the present embodiment, the first insulator 12 in FIG. 5(A) is etched after forming the mask body 13 in FIG. 4(B). However, it is also possible to reverse this order by adhering or forming the mask body 13 after forming the opening part 15 by etching the first insulator 12.

Next, in FIG. 5(B), the second insulator 16 is formed to cover the mask body 13 and the first insulator 12. The second insulator 16 can be formed by coating polyimide using a known spin-coating method or printing method and then curing the polyimide by light irradiation or heating. In the vapor deposition mask 100 of the present embodiment, a film thickness (Hc) of the second insulator 16 is 5 µm.

It is possible to use not only polyimide but also an organic film (thin film formed by an organic material) formed by a resin such as epoxy, acrylic and polyethylene terephthalate as the second insulator 16. In addition, an inorganic film (thin film formed by an inorganic material) such as silicon oxide or silicon nitride may also be used. In addition, a stacked film obtained by arbitrarily combining these may also be used.

At this time, it is preferred to use polyimide which has low viscosity when coating polyimide as the second insulator 16. In this way, a planarization effect can be provided to the second insulator 16, and a deposition hole of the final vapor deposition mask 100 can be formed into a smoother taper shape.

Next, in FIG. 6(A), the second insulator 16 is processed by laser etching to form a plurality of opening parts 17. In the present embodiment, since the plurality of opening parts 17 are formed in a stripe shape in the vapor deposition region 102, the second insulator 16 is also formed in a stripe shape in the vapor deposition region 102.

At this time, the opening part 17 is formed so that the mask body 13 and the first insulator 12 are completely covered by the second insulator 16. That is, the opening part 17 of the second insulator 16 is formed inside of the opening part 15 of the first insulator 12 formed in FIG. 5(A). A width (Wc) of the opening part 17 arranged in the second insulator 16 is 30 µm as described above.

Furthermore, in the present embodiment, although an example is shown in which the opening part 17 is formed by laser etching, anisotropic etching may also be performed by dry etching using an etching gas the same as etching of the first insulator 12.

Finally, in FIG. 6(B), the support substrate 11 is peeled off. In this way, the vapor deposition mask 100 of the present embodiment arranged with the structure and effect explained using FIG. 1 to FIG. 3 is completed.

According to the manufacturing method of the vapor deposition mask 100 in the present embodiment, the mask body (conductive sheet) 13 which is the basic skeleton of a vapor deposition mask, is sandwiched between the first insulator 12 and the second insulator 16. In this way, it is possible to realize the vapor deposition mask 100 including fine vapor deposition holes (slits or rectangular holes) while maintaining the strength (rigidity) of the entire vapor deposition mask.

In addition, since an inner wall of the deposition hole 103 of the final vapor deposition mask 100 has a step shape (substantially tapered shape), there are hardly any shadows formed on the vapor deposition material which enters from various angles. Therefore, it is possible to manufacture the vapor deposition mask 100 which can form a vapor deposition film having a uniform film thickness distribution.

Furthermore, by adopting a structure in which the mask body 13 is sandwiched between the first insulator 12 and the second insulator 16, even if a substrate which is the object of vapor deposition is made to contact the vapor deposition mask 100, the mask body 13 does not come into direct contact with the substrate which is the object of vapor deposition. Therefore, it is possible to manufacture a highly reliable vapor deposition mask in which foreign objects (for example, metal foreign objects) are generated due to contact between the two.

In addition, when the second insulator 16 is etched, since etching is performed in a state where the mask body 13 and the first insulator 12 are covered by the second insulator 16, problems such as film peeling of the first insulator 12, thermal expansion of the mask body 13 and generation of foreign objects from the mask body 13 can be reduced.

Second Embodiment

<Schematic Structure of a Vapor Deposition Mask>

Figure 7:
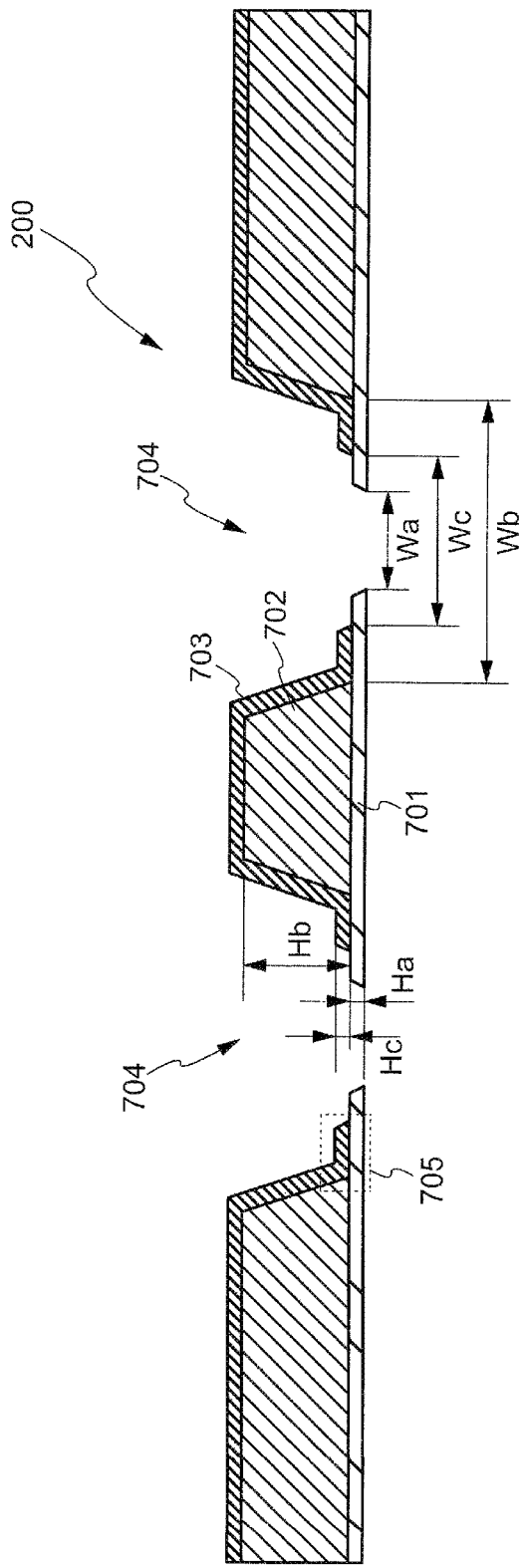
FIG. 7 is a cross-sectional diagram showing a schematic structure of a vapor deposition mask according to a second embodiment of the present invention.

A cross-sectional structure of a vapor deposition mask 200 according to a second embodiment of the present invention is shown in FIG. 7. Although a planar view of the schematic structure of the vapor deposition mask 200 of the second embodiment is as shown in FIG. 1, a cross-sectional structure is different from that of the vapor deposition mask 100 of the first embodiment. Specifically, the vapor deposition mask 200 of the second embodiment is different to the vapor deposition mask 100 of the first embodiment in that the first opening part formed in the first insulator is located further to the inside than the second opening part formed in the second insulator. The other points are the same as those of the vapor deposition mask 100 of the first embodiment.

In FIG. 7, 701 is a first insulator, 702 is a mask body and 703 is a second insulator. In the present embodiment, a metal foil formed by an invar material is used as the mask body 702, and polyimide is used as the first insulator 701 and the second insulator 703. The materials forming the first insulator 701, the mask body 702, and the second insulator 703 are not limited to these as explained in the first embodiment.

Here, when a film thickness of the first insulator 701 is Ha (typically 1 to 5 µm), a thickness of the mask body 702 is Hb (typically 10 to 50 µm) and a film thickness of the second insulator 703 is Hc (typically 10 to 20 µm), it is preferred that the relationship Ha≤Hc is established between the thickness (Ha) of the first insulator 701 and the film thickness (Hc) of the second insulator 703. For example, in the vapor deposition mask 200 of the present embodiment, the film thickness (Ha) of the first insulator 701 is 5 µm, the film thickness (Hb) of the mask body 702 is 30 µm and the film thickness (Hc) of the second insulator 703 is 10 µm.

In this way, a structure is formed in which only the first insulator 701 having the film thickness Ha is arranged in the vicinity of a hole through which a vapor deposition material passes at the bottom part of a vapor deposition hole 704. As a result, as is shown in FIG. 19(A), shadows are not formed on the vapor deposition material (typically an organic material) at an opening end part. Therefore, it is possible to prevent variation in a film thickness distribution of a vapor deposition film as explained using FIG. 19(B).

In addition, by setting the film thickness (Hc) of the second insulator 703 to 10 to 20 µm, rigidity of the mask body 702 is reinforced, and it is possible to increase overall rigidity of the vapor deposition mask 200. Also in this case, since shadows are not formed on the vapor deposition material at an opening end part by setting the film thickness (Ha) of the first insulator 701 to 3 to 5 µm, it is possible to prevent variation in a film thickness distribution of a vapor deposition film.

Furthermore, when the width (typically, 20 to 40 µm) of the first opening part formed in the first insulator 701 is Wa, the width (typically, 30 to 50 µm) of the main opening part formed in the mask body 702 is Wb, and the width (typically 25 to 4 µm) of the second opening part formed in the second insulator 703 is Wc, it is preferred that the relationship Wa≤Wc≤Wb is established between the widths of these opening parts. For example, in the vapor deposition mask 200 of the present embodiment, the width (Wa) of the first opening part formed in the first insulator 701 is 30 µm, the width (Wb) of the main opening part formed in the mask body 702 is 40 µm and the width (Wc) of the second opening part formed in the second insulator 703 is 35 µm.

In FIG. 7, the width (Wa) of the first opening part formed in the first insulator 701 corresponds to the width (slit width) of the vapor deposition hole 103 shown in FIG. 1(B). That is, in the vapor deposition mask 200 of the present embodiment, the width (Wa) of the first opening part formed in the first insulator 701 substantially determines the opening width of the vapor deposition hole 704 in the vapor deposition mask 200.

By adopting such a structure, as is shown in FIG. 7, the second opening part of the second insulator 703 is located inside of the main opening part formed in the mask body 702, and the first opening part of the first insulator 701 is located further to the inside. That is, a step shaped (substantially tapered shape) step is formed on an inner wall of the vapor deposition hole 704, and a vapor deposition material entering from various angles enters more easily.

That is, in the vapor deposition mask 200 shown in FIG. 7, the first insulator 701 is located further to the inside of the main opening part than the second insulator 703, and the first opening part of the first insulator 701 is located further to the inside than the second opening part of the second insulator 703. Furthermore, a region of the first insulator 701 located at an end part of the first opening part does not overlap with the second insulator 703 and the mask body 702. In addition, a film thickness of the first insulator 701 is thinner than a film thickness of the second insulator 703. Furthermore, the first insulator 701 includes a part which does not overlap the second insulator 703 and the mask body 702, and a step is formed on the inside of the main opening part by this part and the second insulator 703.

In addition, the first insulator 701 and the second insulator 703 contact each other at a surface as indicated by the frame line 705. In this way, the mask body 702 can be completely covered by the first insulator 701 and the second insulator 703. As a result, even when a substrate which is the object of vapor deposition and the vapor deposition mask 200 are brought into contact, it is possible to prevent the generation of foreign objects due to contact between the two.

<Manufacturing Method of a Vapor Deposition Mask>

Figure 8:
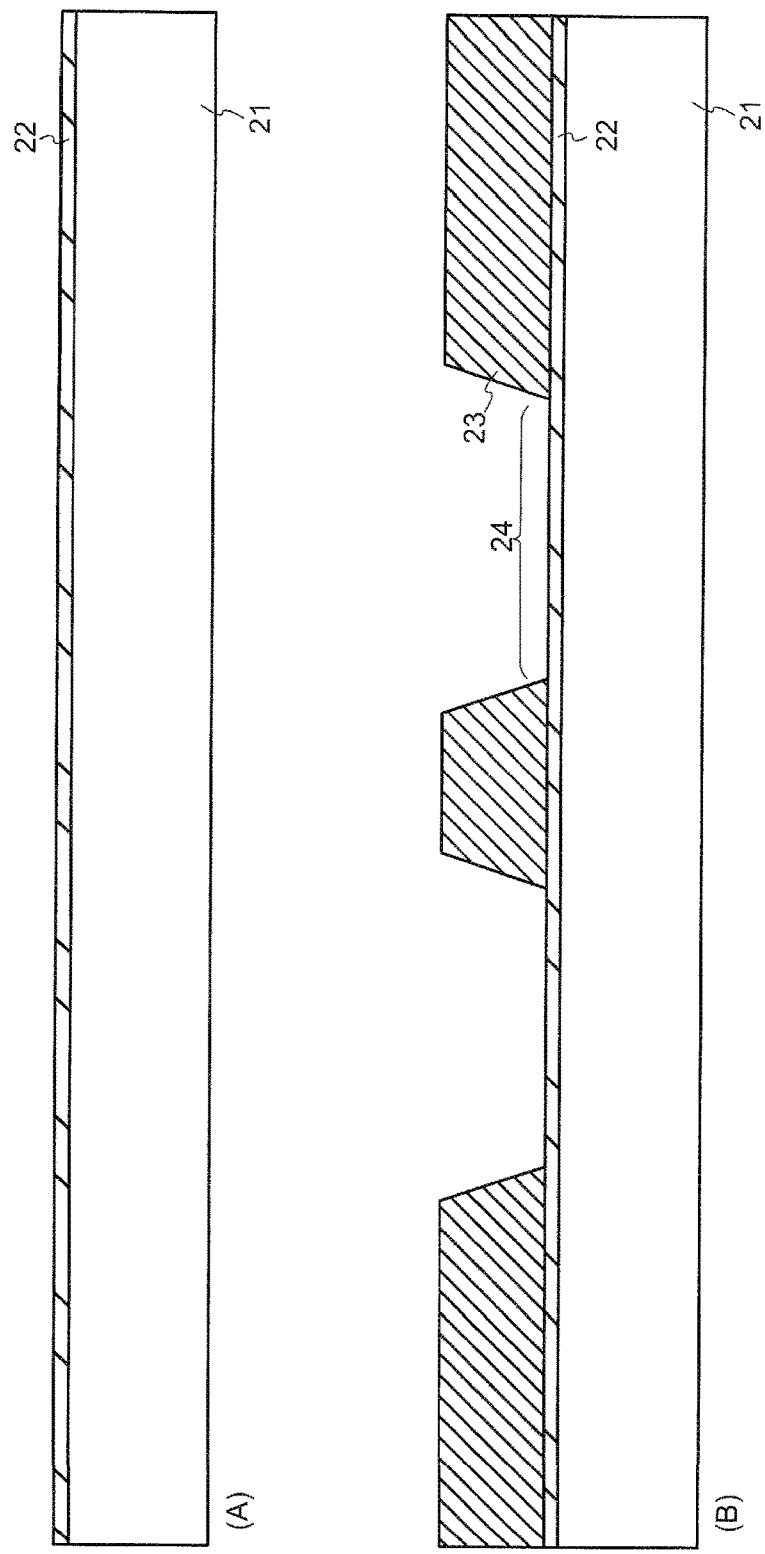
FIG. 8 is a diagram showing a manufacturing method of a vapor deposition mask according to a second embodiment of the present invention.
Figure 9:
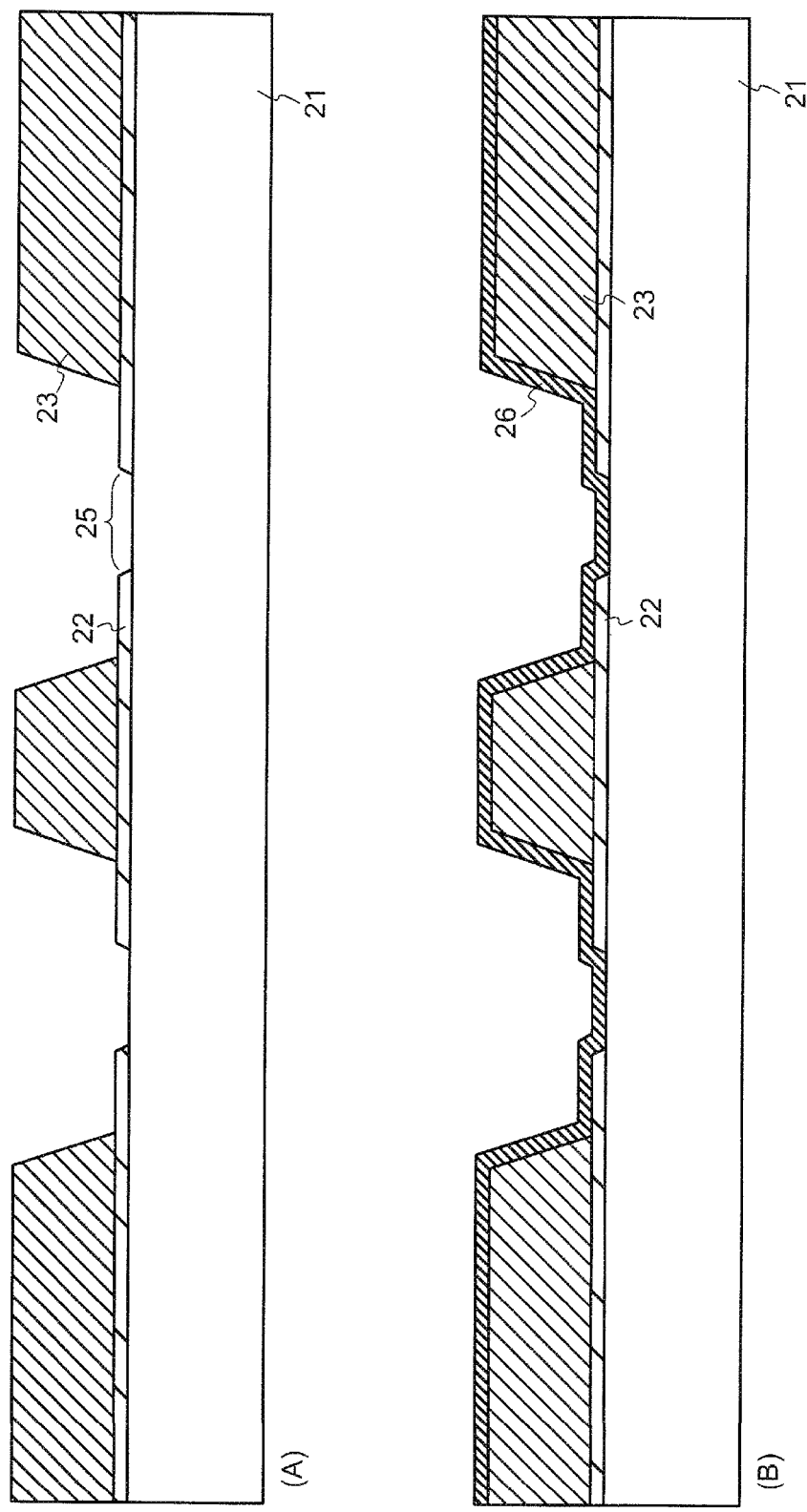
FIG. 9 is a diagram showing a manufacturing method of a vapor deposition mask according to a second embodiment of the present invention.
Figure 10:
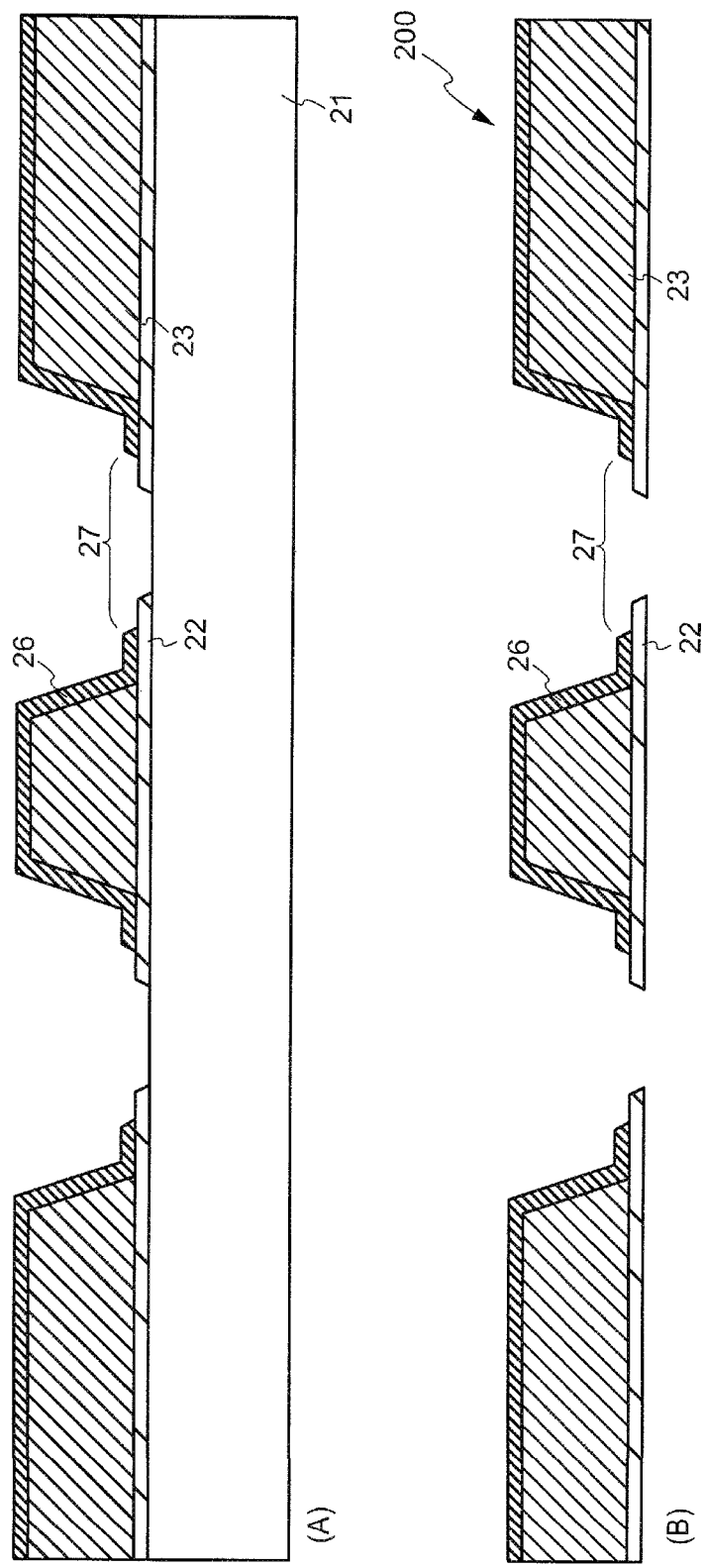
FIG. 10 is a diagram showing a manufacturing method of a vapor deposition mask according to a second embodiment of the present invention.

A manufacturing method of the vapor deposition mask 200 according to the second embodiment of the present invention is shown in FIG. 8 to FIG. 10. Furthermore, in the vapor deposition mask 200 of the second embodiment, except the cross-sectional structure and film thickness being different, it is possible to use an insulator or a conductor formed by the same material as that of the vapor deposition mask 100 of the first embodiment. Therefore, in the present embodiment, although not repeatedly described, each element such as an insulator and a conductor is not limited to the example described in the present embodiment, and it is possible to use the materials described in the first embodiment.

In FIG. 8(A), a resin film formed of polyimide is formed as a first insulator 22 on a support substrate 21 formed by a glass substrate. The first insulator 12 can be formed by coating polyimide using a known spin-coating method or printing method and then curing the polyimide by light irradiation or heating. In the vapor deposition mask 200 of the present embodiment, a film thickness (Ha) of the first insulator 12 is set to 5 μm.

Furthermore, a separate adhesive sheet (not shown in the diagram) may also be arranged between the support substrate 21 and the first insulator 22 in the present embodiment the same as in the first embodiment.

In FIG. 8(B), a mask body (conductive sheet) 23 serving as a basic skeleton of a vapor deposition mask is adhered onto the first insulator 22. In the present embodiment, a metal foil (metal sheet) using an invar material which is a magnetic metal is used as the mask body. In the vapor deposition mask 200 of the present embodiment, the film thickness (Hb) of the mask body 23 is 30 μm.

Furthermore, it is possible to make the first insulator 22 function as an adhesive by adhering the mask body 23 before curing the first insulator 22 and then curing the first insulator 22.

In the vapor deposition mask 200 of the present embodiment, the width (Wb) of the main opening part 24 arranged in the mask body 23 is 40 μm as described above.

In this embodiment, although an example was shown in which the mask body 23 prepared in advance is adhered, the mask body may be formed by patterning after forming the conductive film by a known method as explained in the first embodiment.

Next, in FIG. 9(A), the first insulator 22 is etched to form a plurality of opening parts 25. In the present embodiment, the opening part 25 is formed by laser etching. Naturally, it is also possible to use anisotropic etching by dry etching using an etching gas instead of laser etching.

In the vapor deposition mask 200 of the present embodiment, the width (Wa) of the opening part 25 arranged in the first insulator 22 is 30 μm as described above.

Furthermore, although the first insulator 22 is etched after the mask body 23 is formed in the present embodiment, it is also possible to adhere or form the mask body 23 after forming the opening part 25 by etching the first insulator 22.

In FIG. 9(B), a polyimide film is formed as the second insulator 26 to cover the mask body 23 and the first insulator 22. The second insulator 26 can be formed by coating polyimide using a known spin-coating method or printing method and then curing the polyimide by light irradiation or heating. In the vapor deposition mask 200 of the present embodiment, the film thickness (Hc) of the second insulator 26 is 10 μm.

At this time, it is preferred to use polyimide which has a low viscosity when coating polyimide as the second insulator 26. In this way, a planarization effect can be provided to the second insulator 26, and the opening part of the final vapor deposition mask can be formed into a smoother taper shape.

Next, in FIG. 10(A), the second insulator 26 is processed by laser etching to form a plurality of opening parts 27. In the present embodiment, since the plurality of opening parts 27 are formed in a stripe shape in a vapor deposition region, the second insulator 26 is also formed in a stripe shape in the vapor deposition region.

At this time, the opening part 27 is formed so that the mask body 23 is completely covered by the second insulator 26. Specifically, the opening part 27 is formed to be wider than the opening part 25 formed in FIG. 9(A), and the mask body 23 is sandwiched between the first insulator 22 and the second insulator 26. The width (Wc) of the opening part 27 arranged in the second insulator 26 is 35 μm as described above.

Furthermore, in the present embodiment, although an example was shown in which the opening part 27 is formed by laser etching, anisotropic etching using an etching gas can also be used the same as the etching of the first insulator 22. In the present embodiment, since the first insulator 22 and the second insulator 26 are formed from the same polyimide, time control is strictly performed when the second insulator 26 is etched. In this way, it is possible to minimize the amount of etching of the first insulator 22 after etching of the second insulator 26 is completed.

Finally, in FIG. 10(B), the support substrate 21 is peeled off. In this way, the vapor deposition mask 200 of the present embodiment including the structure and effect explained using FIG. 7 is completed.

According to the manufacturing method of the vapor deposition mask 200 in the present embodiment, the mask body (conductive sheet) 23 serving as the basic skeleton of the vapor deposition mask is sandwiched between the first insulator 22 and the second insulator 26. In this way, it is possible to realize a vapor deposition mask including fine vapor deposition holes (slits or rectangular holes) while maintaining the strength (rigidity) of the entire vapor deposition mask.

In addition, since an inner wall of the vapor deposition hole 704 of the final vapor deposition mask 200 has a step shape (substantially tapered shape), shadows are hardly formed on the vapor deposition material entering from various angles. Therefore, it is possible to manufacture a vapor deposition mask 200 which can form a vapor deposition film having a uniform film thickness distribution.

Furthermore, by adopting a structure in which the mask body 23 is sandwiched between the first insulator 22 and the second insulator 26, even if the substrate which is the object of vapor deposition and the vapor deposition mask 200 are brought into contact, the mask body 23 does not come into direct contact with the substrate which is the object of vapor deposition. Therefore, it is possible to manufacture a highly reliable vapor deposition mask in which foreign objects are not generated (for example, metallic foreign objects) due to contact between the two.

In addition, since etching is performed in a state where the mask body 23 is covered by the second insulator 26 at the time of etching the second insulator 26, it is possible to reduce problems such as thermal expansion of the mask body 23 and generation of foreign objects from the mask body 23.

Third Embodiment

<Schematic Structure of a Vapor Deposition Mask>

Figure 11:
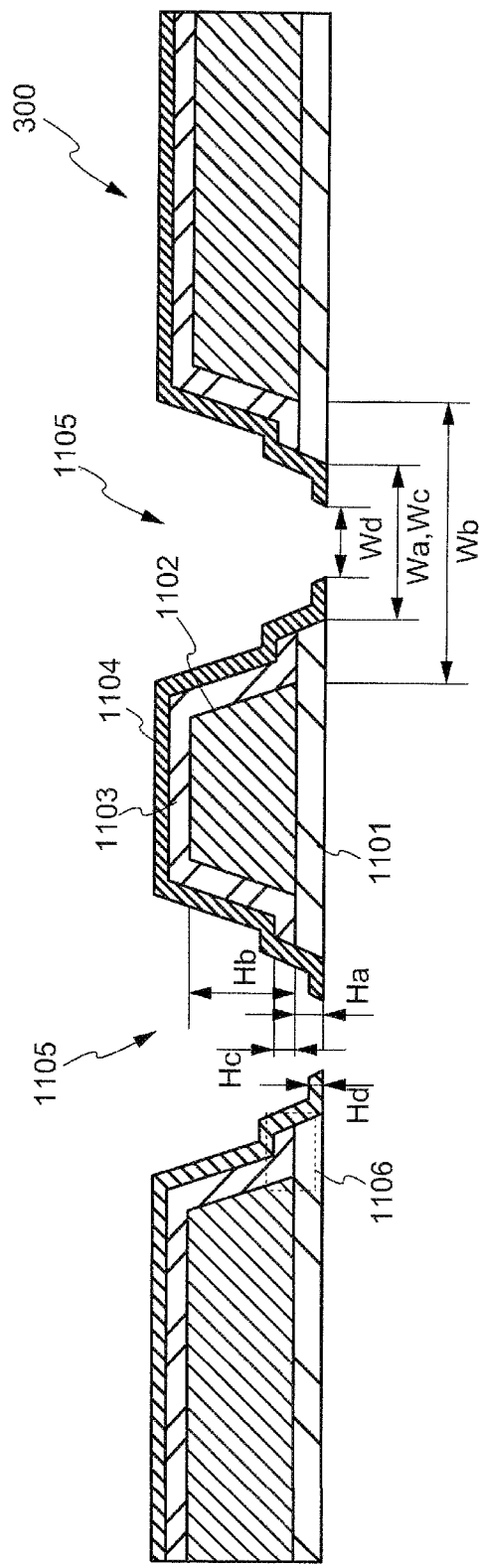
FIG. 11 is a cross-sectional diagram showing a schematic structure of a vapor deposition mask according to a third embodiment of the present invention.
Figure 12:
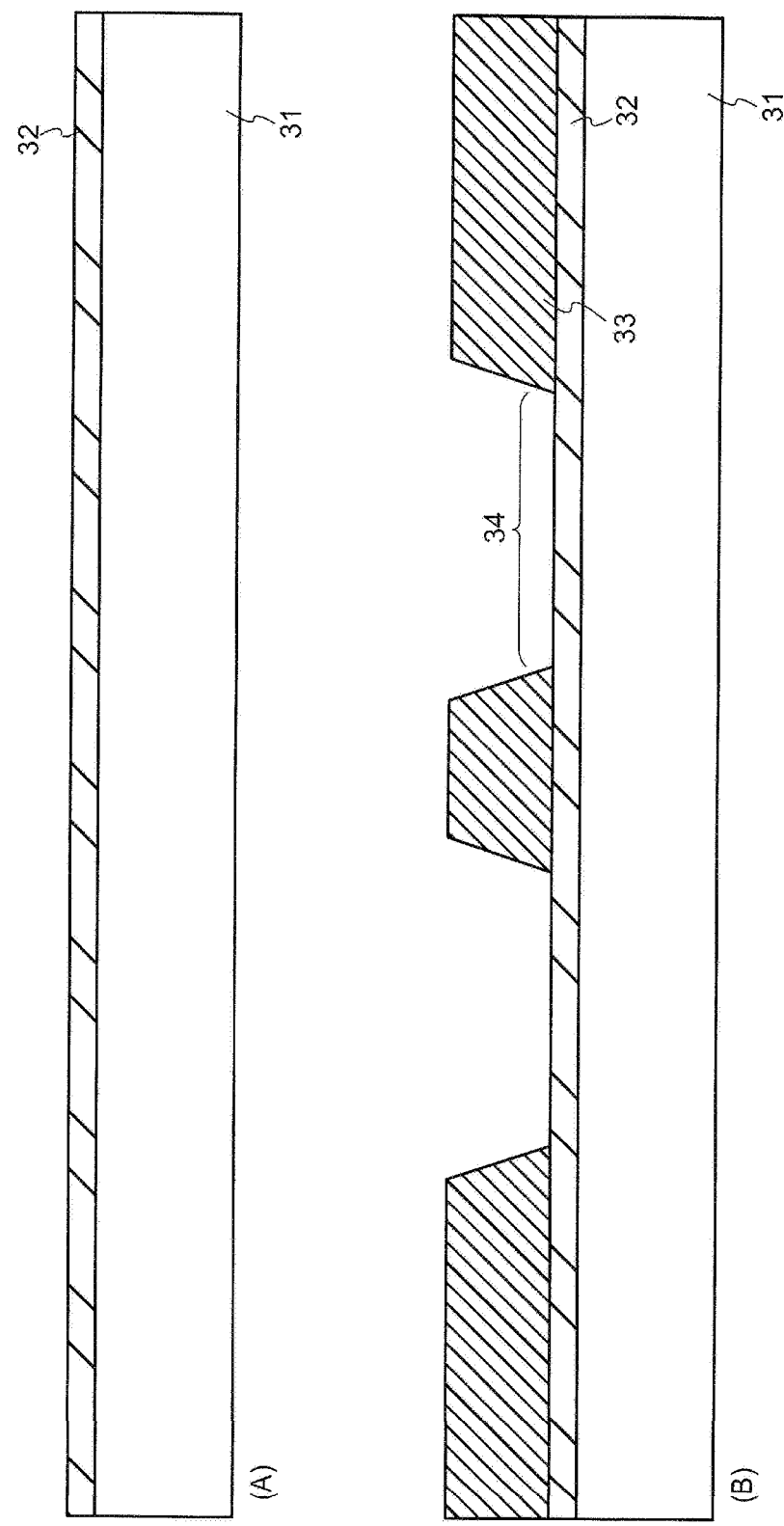
FIG. 12 is a diagram showing a manufacturing method of a vapor deposition mask according to a third embodiment of the present invention.

A cross-sectional structure of a vapor deposition mask 300 according to a third embodiment of the present invention is shown in FIG. 11. Although the schematic structure of the vapor deposition mask 300 of the third embodiment is as shown in FIG. 1, a cross-sectional structure is different from that of the vapor deposition mask 100 of the first embodiment. Specifically, the vapor deposition mask 300 of the third embodiment is different from the vapor deposition mask 100 of the first embodiment in that the mask body is sandwiched by two insulators and then covered with another insulator. The other points are the same as those of the vapor deposition mask of the first embodiment.

In FIG. 11, 1101 is a first insulator, 1102 is a mask body, 1103 is a second insulator, and 1104 is a third insulator. In the present embodiment, a metal foil made of an invar material is used as the mask body 1102, and polyimide is used as the first insulator 1101, the second insulator 1103 and the third insulator 1104. The materials forming the first insulator 1101, the mask body 1102, the second insulator 1103 and the third insulator 1104 are not limited to these as explained in the first embodiment.

That is, the first insulator 1101, the second insulator 1103 and the third insulator 1104 can be formed not only by polyimide but also by an organic film (thin film formed by an organic material) formed by a resin such as epoxy, acrylic, and polyethylene terephthalate. In addition, it is also possible to use an inorganic film (thin film formed by an inorganic material) such as silicon oxide or silicon nitride. Furthermore, an organic film and inorganic film may be arbitrarily combined.

Here, when a film thickness of the first insulator 1101 is Ha (typically 1 to 20 μm), a film thickness of the mask body 1102 is Hb (typically 30 to 200 μm), a film thickness of the second insulator 1103 is Hc (typically 1 to 20 μm) and a film thickness of the third insulator 1104 is Hd (typically 1 to 5 μm), it is preferred that the relationship Hd≤Ha or Hd≤Hc is established between the film thickness (Ha) of the first insulator 1101, the film thickness (Hc) of the second insulator 1103, and the film thickness (Hd) of the third insulator 1104. For example, in the vapor deposition mask 300 of the present embodiment, the film thickness (Ha) of the first insulator 1101 is 10 μm, the thickness (Hb) of the mask body 1102 is 30 μm, the film thickness (Hc) of the second insulator 1103 is 10 μm and the film thickness (Hd) of the third insulator 1104 is 5 μm.

In this way, an inner wall of a vapor deposition hole 1105 is covered by the third insulator 1104, and only the third insulator 1104 with a film thickness (Hd) of about 3 to 5 μm is arranged at a bottom part thereof. As a result, as is shown in FIG. 19(A), shadows are not formed on the vapor deposition material (typically, an organic material) at an opening end part. Therefore, it is possible to prevent variation in a film thickness distribution of a vapor deposited film as explained using FIG. 19(B).

In addition, by setting the film thickness (Ha) of the first insulator 1101 and the film thickness (Hc) of the second insulator 1103 to 10 to 20 μm, the rigidity of the mask body 1102 is reinforced and it is possible to increase the rigidity of the entire vapor deposition mask 300. Even in this case, since shadows are not formed on a vapor deposition material at an opening end part by setting the film thickness (Hd) of the third insulator 1104 to 3 to 5 μm, it is possible to prevent a variation in film thickness distribution of a vapor deposition film.

Naturally, it is also possible to form the first insulator 1101, the second insulator 1103, and the third insulator 1104 as inorganic insulators of about 1 μm and form a taper shape which also serves as a reinforcement of an opening part.

Furthermore, when a width (typically, 25 to 45 μm) of the first opening part formed in the first insulator 1101 is Wa, a width (typically, 30 to 50 μm) of the main opening part formed in the mask body 1102 is Wb, a width (typically 25 to 45 μm) of the second opening part formed in the second insulator 1103 is Wc, and a width (typically 20 to 40 μm) of the third opening part formed in the third insulator 1104 is Wd, it is preferred that the relationship Wd≤Wa≈Wc≤Wb is established between the widths of these opening parts.

Furthermore, in the present embodiment, since an opening part is formed by collectively etching the first insulator 1101 and the second insulator 1103, the film thickness (Ha) of the first insulator 1101 and the film thickness (Hc) of the second insulator 1103 are almost equal. Here, "almost equal" includes not only the case of a complete match but also the case of a slight difference. In the description related to the width of the opening part above, this point is expressed as Wa≈Wc. That is, since both the first insulator 1101 and the second insulator 1103 have a film thickness of 10 to 20 μm, in the case where etching is performed so that a cross-section has a taper shape, a slight difference occurs between the opening widths of the first insulator 1101 and the second insulator 1103.

In the vapor deposition mask 300 of the present embodiment, the width (Wa) of the first opening part formed in the first insulator 1101 is 35 μm, the width (Wb) of the main opening part formed in the mask body 1102 is 40 μm, the width (Wc) of the second opening part formed in the second insulator 1103 is 35 μm and the width (Wd) of the third opening part formed in the third insulator 1104 is 30 μm.

In FIG. 11, the width (Wd) of the third opening part formed in the third insulator 1104 corresponds to the width (slit width) of the vapor deposition hole 103 shown in FIG. 1(B). That is, in the vapor deposition mask 300 of the present embodiment, the width (Wd) of the third opening part formed in the third insulator 1104 substantially determines the opening width of the vapor deposition hole 1105 in the vapor deposition mask 300.

By adopting such a structure, as is shown in FIG. 11, opening parts of the first insulator 1101 and the second insulator 1103 are respectively located inside of the main opening part formed in the mask body 1102, and the third opening part of the third insulator 1104 is located even further to the inside. That is, a step shaped (substantially tapered shape) step is formed on the inner wall of the vapor deposition hole 1105, and a vapor deposition material entering from various angles enters more easily.

That is, the deposition mask 300 shown in FIG. 11 is arranged with the mask body 1102 including a main opening part, a side surface of the main opening part, an upper surface intersecting the side surface, and a lower surface intersecting the side surface and opposing the upper surface. Furthermore, the first insulator 1101 is arranged in contact with the lower surface, the second insulator 1103 is arranged in contact with the upper surface and the side surface, and the third insulator 1104 is arranged in contact with the second insulator 1103 and opposing the upper surface and the side surface via the second insulator 1103. The first insulator 1101 includes a first region located inside of the main opening part and a first opening part located in the first region. The second insulator 1103 includes a second region located inside of the main opening part and a second opening part located in the second region. The third insulator 1104 includes a third region located inside of the main opening part and a third opening part located in the third region. The mask body 1102 is sandwiched between the first insulator 1101 and the second insulator 1103. The third insulator 1104 includes a region located further to the inside of the main opening part than the first insulator 1101 and the second insulator 1103 and does not overlap with the first insulator 1101, the second insulator 1103 and the mask body 1102.

Furthermore, in the vapor deposition mask 300 shown in FIG. 11, among the film thickness of the first insulator 1101, the film thickness of the second insulator 1103 and the film thickness of the third insulator 1104, the film thickness of the third insulator 1104 is the thinnest. In addition, among the first opening part, the second opening part and the third opening part, the third opening part is located at the innermost side. In addition, the third region is formed with a step inside of a main opening part by a part which does not overlap with the first insulator 1101, the second insulator 1103, and the mask body 1102, a part which contacts with a side surface of the first opening part and a side surface of the second opening part, and a part which contacts with an upper surface of the second region described above.

In addition, the first insulator 1101 and the second insulator 1103 are in contact at a surface as shown by a frame line 1106 inside the main opening part formed in the mask body 1102. In this way, the mask body 1102 can be completely covered using the first insulator 1101 and the second insulator 1103. As a result, even if the vapor deposition mask 300 is brought into contact with a substrate which is the object of vapor deposition, it is possible to prevent the generation of foreign objects due to contact between the two.

<Manufacturing Method of a Vapor Deposition Mask>

A manufacturing method of the vapor deposition mask 300 according to the third embodiment of the present invention is shown in FIGS. 12 to 15. Furthermore, apart from a cross-sectional structure and the film thickness of the insulation films being different, an insulator or a conductor formed by the same material as that of the vapor deposition mask 100 of the first embodiment can be used for the vapor deposition mask 300 of the third embodiment. Therefore, although not repeatedly described in the present embodiment, each element such as an insulator and a conductor is not limited to the example shown in the present embodiment, and the material explained in the first embodiment can be used.

In FIG. 12(A), a resin film formed by polyimide is formed as a first insulator 32 above a support substrate 31 formed by a glass substrate. The first insulator 32 can be formed by coating polyimide by a known spin-coating method or printing method and then curing the polyimide by light irradiation or heating. In the vapor deposition mask 300 of the present embodiment, a film thickness (Ha) of the first insulator 32 is set to 10 μm.

Furthermore, a separate adhesive sheet (not shown in the diagram) may also be provided between the support substrate 31 and the first insulator 32 in the present embodiment the same as in the first embodiment.

In FIG. 12(B), a mask body (conductor sheet) 33 serving as a basic skeleton of a vapor deposition mask is adhered onto the first insulator 32. In the present embodiment, a metal foil (metal sheet) using an invar material which is a magnetic metal is used as the mask body. In the vapor deposition mask 300 of the present embodiment, the thickness (Hb) of the mask body 33 is 30 μm.

Furthermore, it is also possible to make the first insulator 32 function as an adhesive by adhering the mask body 33 before curing the first insulator 32 and then curing the first insulator 32.

In the vapor deposition mask 300 of the present embodiment, the width (Wb) of a main opening part 34 arranged in the mask body 33 is 40 μm as described above.

In addition, in the present embodiment, although an example was shown in which the mask body 33 prepared in advance is adhered, a mask body may also be formed by patterning after forming a conductive film by a known method as described in the first embodiment.

Next, in FIG. 13(A), a second insulator 35 formed from polyimide is formed to cover the mask body 33. The second insulator 35 can be formed by coating polyimide using a known spin-coating method or printing method and then curing the polyimide by light irradiation or heating. In the vapor deposition mask 300 of the present embodiment, a film thickness (Hc) of the second insulator 35 is set to 10 μm.

Figure 13:
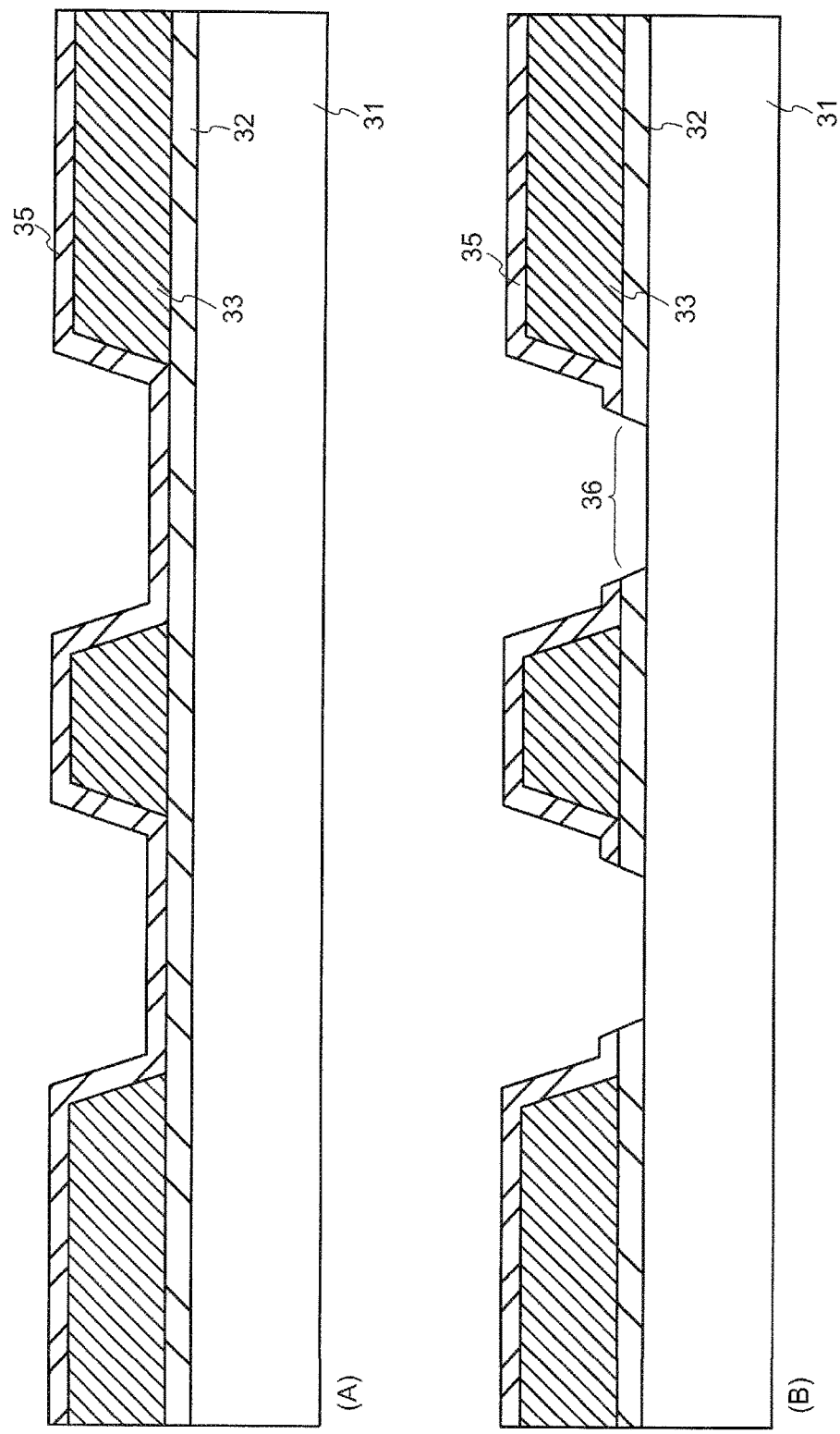
FIG. 13 is a diagram showing a manufacturing method of a vapor deposition mask according to a third embodiment of the present invention.
Figure 14:
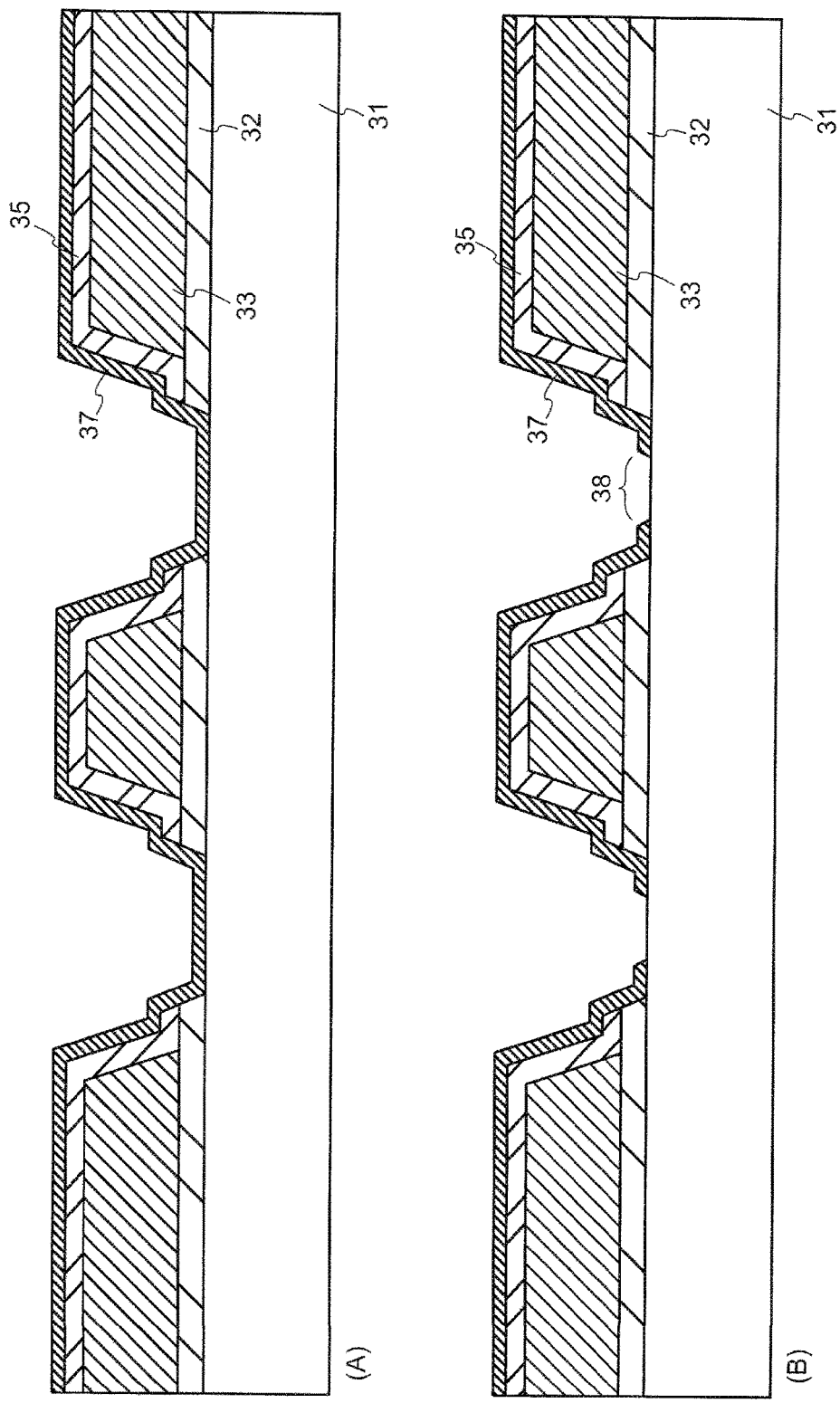
FIG. 14 is a diagram showing a manufacturing method of a vapor deposition mask according to a third embodiment of the present invention.

In FIG. 13 (B), the first insulator 32 and the second insulator 35 are collectively etched to form a plurality of opening parts 36. In the present embodiment, the opening part 36 is formed by laser etching. Naturally, it is also possible to use anisotropic etching by dry etching using an etching gas instead of laser etching.

In the vapor deposition mask 300 of the present embodiment, the widths (Wa, Wc) of the opening parts 36 respectively arranged in the first insulator 32 and the second insulator 35 are 30 μm as described above.

Next, in FIG. 14(A), a polyimide film is formed as the third insulator 37 to cover the first insulator 32, the mask body 33, and the second insulator 35. The third insulator 37 can be formed by coating polyimide using a known spin-coating method or printing method and then curing the polyimide by light irradiation or heating. In the vapor deposition mask 300 of the present embodiment, a film thickness (Hd) of the third insulator 37 is 5 μm.

At this time, it is preferred to use polyimide which has low viscosity when coating polyimide as the third insulator 37. In this way, a planarization effect can be provided to the third insulator 37, and a vapor deposition hole of the final vapor deposition mask can be formed into a smoother taper shape.

In FIG. 14(B), the third insulator 37 is processed by laser etching to form a plurality of opening parts 38. In the present embodiment, since the plurality of opening parts 38 are formed in a stripe shape in a vapor deposition region, the third insulator 37 is also formed in a stripe shape in the vapor deposition region.

At this time, the opening part 38 is formed so that the first insulator 32 and the second insulator 35 are completely covered by the third insulator 37. Specifically, the opening part 38 is formed inside of the opening 36 formed in FIG. 13(B). The width (Wd) of the opening 38 arranged in the third insulator 37 is 30 μm as described above.

In the present embodiment, although an example was shown in which the opening part 38 is formed by laser etching, it is also possible to use anisotropic etching the same as the etching of the first insulator 32 and the second insulator 35.

Figure 15:
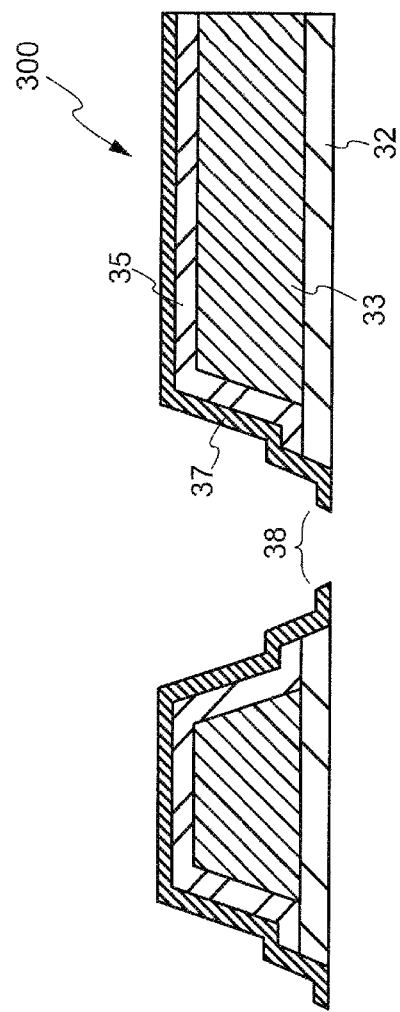
FIG. 15 is a diagram showing a manufacturing method of a vapor deposition mask according to a third embodiment of the present invention.

Finally, in FIG. 15, the support substrate 31 is peeled off. In this way, the vapor deposition mask 300 of the present embodiment including the structure and effect explained using FIG. 11 is completed.

According to the manufacturing method of the vapor deposition mask 300 in the present embodiment, a structure is obtained in which the mask body (conductor sheet) 33 serving as the basic skeleton of a vapor deposition mask is sandwiched between the first insulator 32 and the second insulator 35. In this way, it is possible to realize a vapor deposition mask including fine vapor deposition holes (slits or rectangular holes) while maintaining the strength (rigidity) of the entire vapor deposition mask.

In addition, since an inner wall of the vapor deposition hole 1105 of the final vapor deposition mask 300 has a step shape (substantially tapered shape), shadows are hardly formed on a vapor deposition material entering from various angles. Therefore, it is possible to manufacture the vapor deposition mask 300 which can form a vapor deposition film having a uniform film thickness distribution.

Furthermore, by adopting the structure in which the mask body 33 is sandwiched between the first insulator 32 and the second insulator 35, even if a substrate which is the object of vapor deposition and the vapor deposition mask 300 are brought into contact, the mask body 33 does not come into direct contact with the substrate which is the object of vapor deposition. Therefore, it is possible to manufacture a highly reliable vapor deposition mask in which foreign objects (for example, metallic foreign objects) are not generated due to contact between the two.

In addition, since etching is performed in a state where the mask body 33 is covered by the first insulator 32 and the second insulator 35 when etching the third insulator 37, it is possible to reduce problems such as thermal expansion of the mask body 33 and generation of foreign objects from the mask body 33.

Fourth Embodiment

Figure 16:
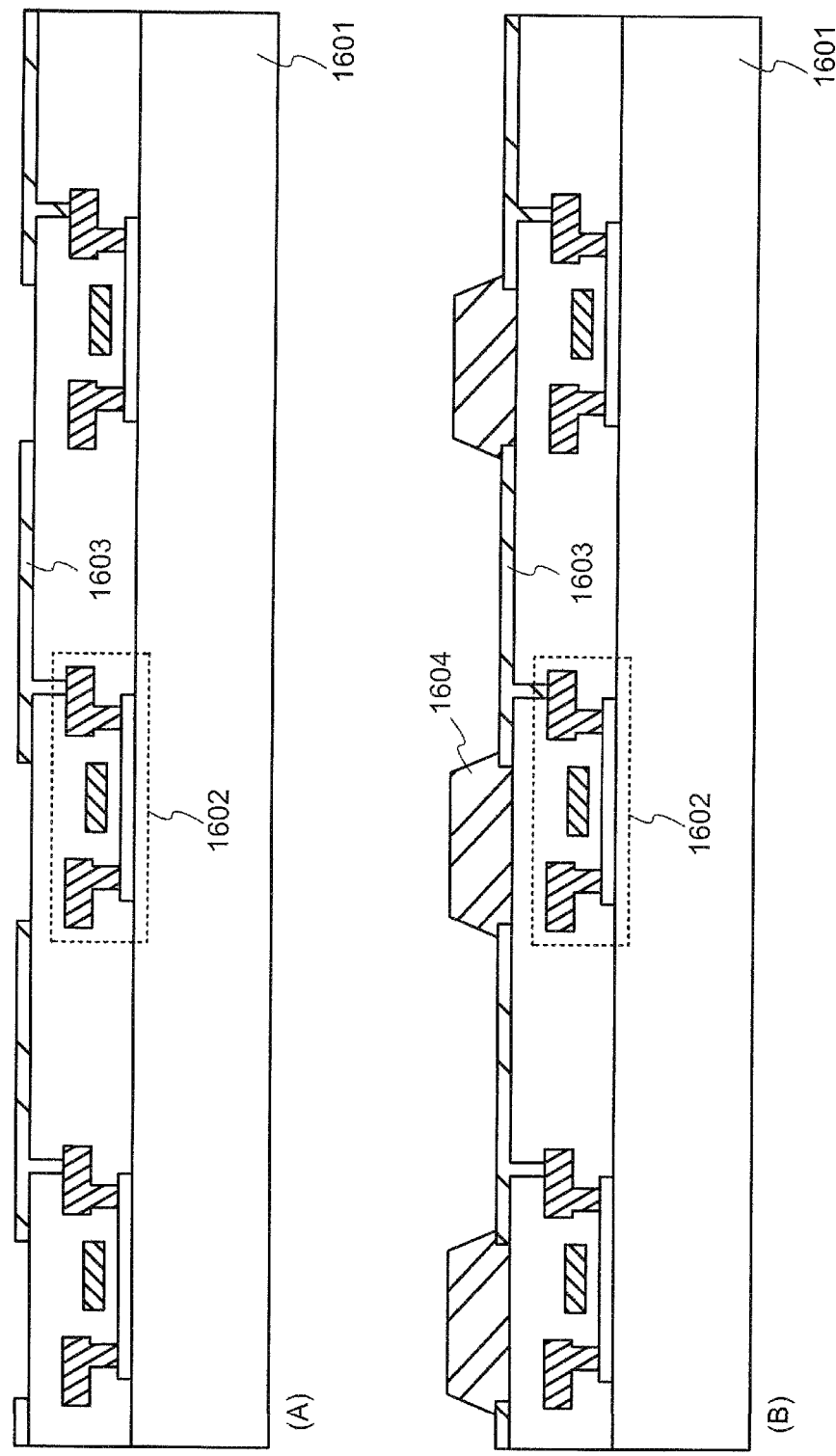
FIG. 16 is a diagram showing a manufacturing method of an organic EL display device according to a fourth embodiment of the present invention.

In the present embodiment, an example is shown in which an organic EL display device is formed using any one of the vapor deposition masks of the first embodiment to the third embodiment of the present invention. FIG. 16 is a diagram showing a manufacturing method of an organic EL display device according to the present embodiment.

In FIG. 16(A), a thin film transistor (TFT) 1602 is formed on a substrate 1601 by a known method. Since the organic EL display device of the present embodiment is a top emission structure that emits light in a vertically upward direction (direction toward an opposing substrate) with respect to a pixel electrode 1603, a glass substrate, a ceramic substrate, a plastic substrate or a metal substrate may be used.

In addition, the thin film transistor 1602 may have a top gate structure or a bottom gate structure. In the organic EL display device of the present embodiment, the thin film transistor 1602 functions as a switching element in a pixel region, and its structure and type of conductivity (n type or P type) may be determined appropriately.

A pixel electrode 1603 formed by a known method is connected to the thin film transistor 1602. In the present embodiment, it is preferred to use a metal film having high reflectance as the pixel electrode 1603 in order to form the top emission structure as described above. In addition, a stacked structure of ITO (Indium Tin Oxide) which is a transparent conductive film with a high work function and a metal film may be used. The pixel electrode 1603 functions as an anode of the organic EL element.

In FIG. 16(B), a bank 1604 is formed for each gap between a plurality of pixel electrodes 1603. The bank 1604 may be formed using a resin film such as polyimide or acrylic and the like. In addition, not only a resin material, but an inorganic material such as silicon nitride or silicon oxide may also be used, or a resin material and an inorganic material may be stacked.

Figure 17:
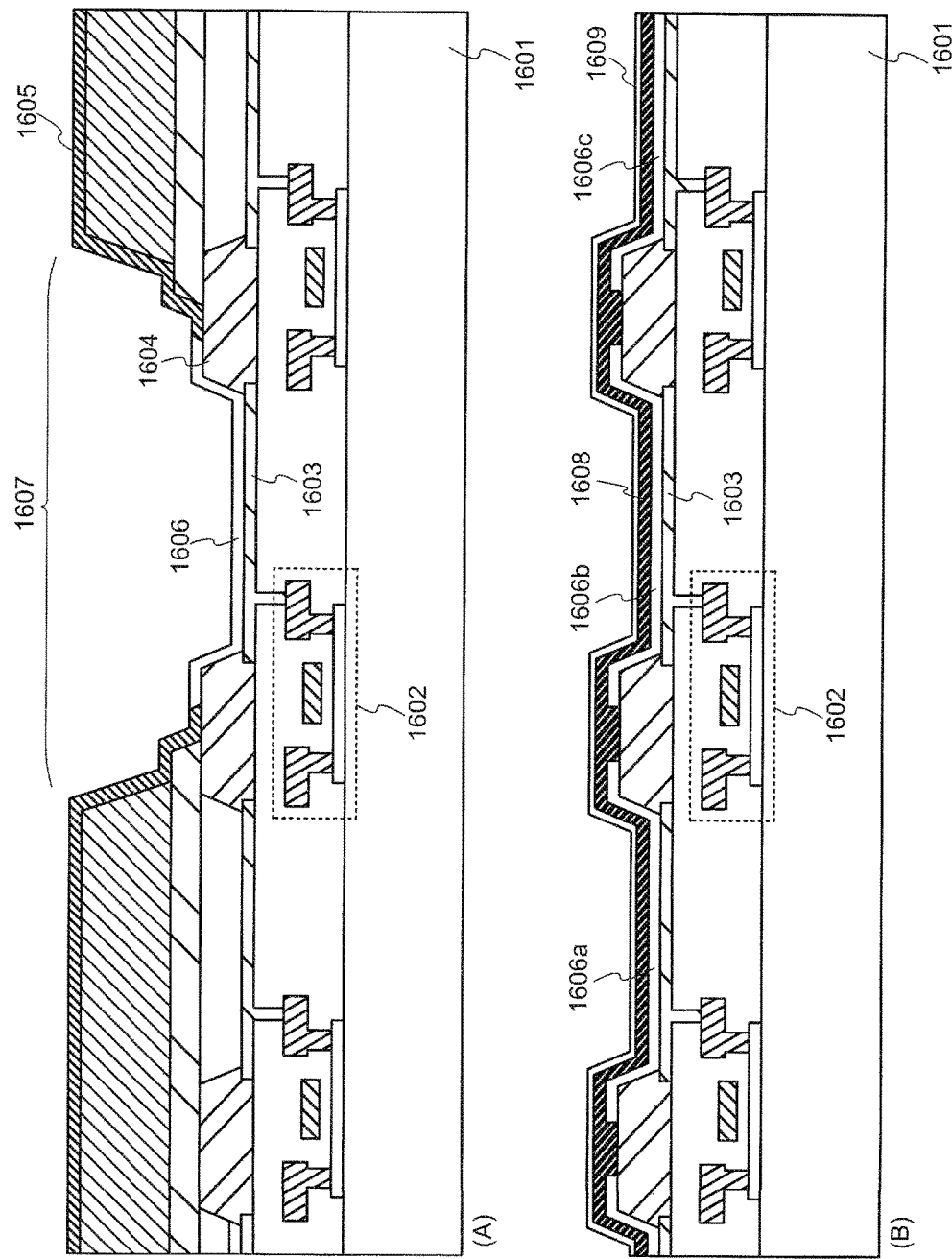
FIG. 17 is a diagram showing a manufacturing method of an organic EL display device according to a fourth embodiment of the present invention.

After forming the bank 1604, a light emitting layer 1606 which forms an EL element is formed by a vapor deposition method using a vapor deposition mask 1605 as shown in FIG. 17(A). Here, formation of the light emitting layer 1606 corresponding to any one of RGB is exemplified. Although the vapor deposition mask 1605 is exemplified using the structure explained in the first embodiment, any of the vapor deposition masks of the first embodiment to the third embodiment may be used.

At this time, the vapor deposition mask 1605 is fixed in a state in which tension is applied to a frame formed by a nickel alloy or stainless steel. In addition, the vapor deposition mask 1605 is pulled by a magnetic force from the rear side of a substrate 1601 (side on which an element is not formed), and is used in close contact with a formation surface of the EL element.

The vapor deposition mask 1605 is arranged with a vapor deposition hole 1607 having a width corresponding to each individual pixel. An organic material forming the light emitting layer 1606 passes through the vapor deposition hole 1607 of the vapor deposition mask 1605 and accumulates on the surface of the pixel electrode 1603 to form the light emitting layer 1606. In the present embodiment, a red emission layer which emits red light, a green emission layer which emits green light and a blue emission layer which emits blue light are sequentially formed as a separate vapor deposition process while shifting the vapor deposition mask 1605.

Furthermore, in this embodiment, although an example is shown in which only a light emitting layer is formed, functional layers such as an electron injection layer, an electron transport layer, a hole injection layer and a hole transport layer may also be formed by a vapor deposition method using the same vapor deposition mask 1605. In addition, not only a structure arranged in a stripe shape but a dot shaped or slot shaped structure opened in each pixel unit may also be aligned with the shape of a pixel.

Next, as is shown in FIG. 17(B), a common electrode 1609 which functions as the cathode of the EL element and a protective film 1610 are formed after forming light emitting layers 1606a to 1606c of each pixel. It is preferred that the common electrode 1609 is formed by a transparent conductive film such as ITO or IZO (zinc oxide doped with indium) having translucency. It is preferred to use an insulation film (for example, silicon nitride film) having high airtightness properties in order to prevent moisture and contaminants from entering the interior of the protective film 1610. In addition, a stress relieving structure and a structure for dealing with foreign objects may be adopted as a multilayer structure in which an organic film such as an acrylic resin is sandwiched between lower layers or intermediate layers.

In this way, the active matrix substrate shown in FIG. 17(B) is completed. An active matrix substrate refers to a substrate on which a switching element formed by a thin film transistor or the like and a light emitting element such as an organic EL element are formed.

Figure 18:
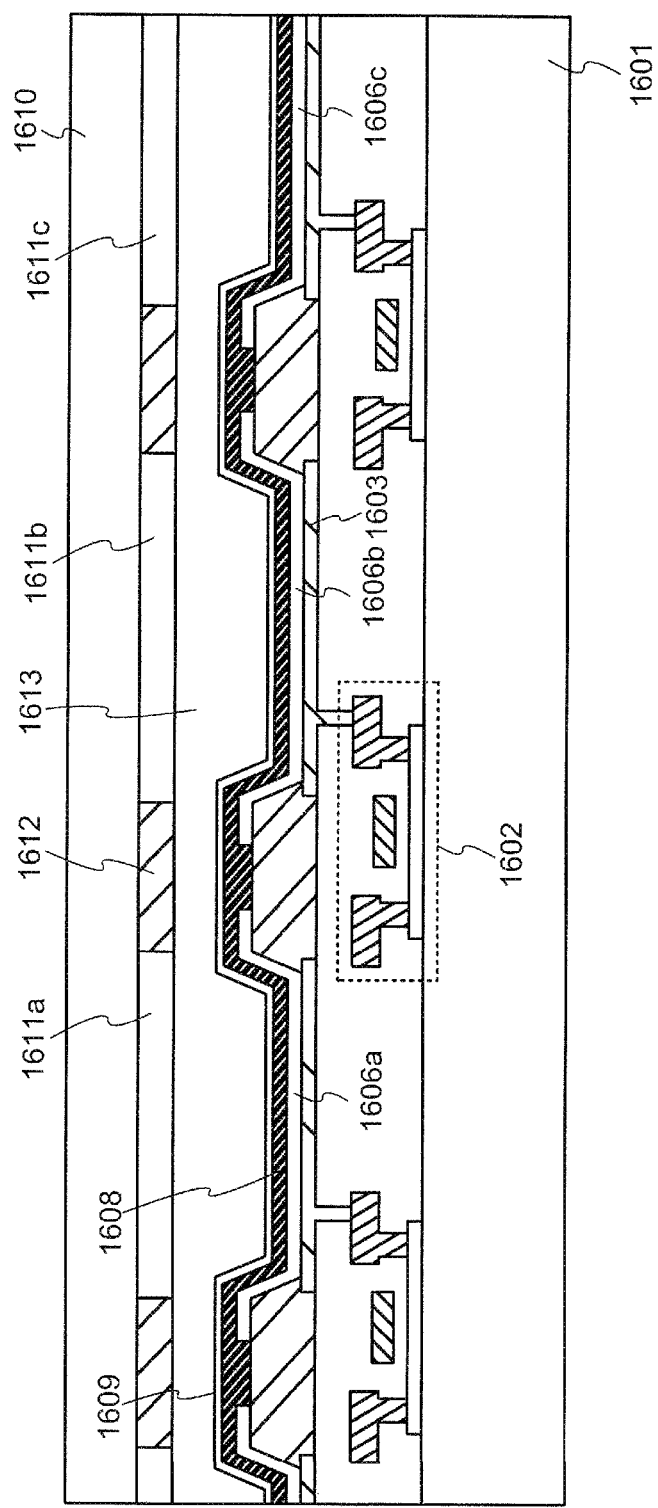
FIG. 18 is a diagram showing a manufacturing method of an organic EL display device according to a fourth embodiment of the present invention.

Finally, as is shown in FIG. 18, an opposing substrate is bonded to complete the organic EL display device of the present embodiment. In FIG. 18, 1611 is a glass substrate. In addition, a red color filter 1612a corresponding to a red pixel, a green color filter 1612b corresponding to a green pixel and a blue color filter 1612c corresponding to a blue pixel may be used according to necessity. 1613 is a black mask arranged between each color filter. Each of these color filters 1612a to 1612c and the black mask 1613 may be formed by a known method.

The opposing substrate in the organic EL display device of the present embodiment is formed by the glass substrate 1611, red color filter 1612a, green color filter 1612b, blue color filter 1612c and the black mask 1613. Naturally, the color filters 1612a to 1612c and the black mask 1613 are not essential structures and can be omitted.

Next, the active matrix substrate shown in FIG. 17(B) and the opposing substrate are adhered using a filling layer 1614 formed by a resin and the organic EL display device shown in FIG. 18 is completed. It is possible to use a transparent resin such as polyimide, acrylic or the like as the filling layer 1614, and the filling layer 1614 may be cured by light irradiation after filling a space between the active matrix substrate and the opposing substrate.

According to the manufacturing method of the organic EL display device of the present embodiment explained above, by forming a light emitting layer using the vapor deposition mask 1605 of the present invention, it is possible to form a light emitting layer having a uniform film thickness distribution. In addition, since a mask body forming the vapor deposition mask 1605 does not directly touch the pixel electrode 1603 or the bank 1604 when forming a light emitting layer, yield of the manufacturing process is improved.

EXPLANATION OF REFERENCE SYMBOLS

100: Vapor Deposition Mask
102: Vapor Deposition Region
103: Vapor Deposition Hole
104: Alignment Mark
201: First Insulator
202: Mask Body
203: Second Insulator
204: Opening Part

What is claimed is:

1. A vapor deposition mask comprising:
a mask body having a main opening part, a side surface of the main opening part, an upper surface intersecting with the side surface, and a lower surface intersecting with the side surface and opposing the upper surface;
a first insulator contacting the lower surface; and
a second insulator contacting the upper surface and the side surface,
wherein
the first insulator includes a first opening part inside the main opening part, and a first region located between the main opening part and the first opening part,
the second insulator includes a second opening part inside the main opening part, and a second region located between the main opening part and the second opening part,
the mask body is sandwiched between the first insulator and the second insulator, and
one of the first region and the second region includes a portion which does not overlap the mask body and an other of the first region and the second region.

2. The vapor deposition mask according to claim 1, wherein a film thickness of the one is thinner than a film thickness of the other.

3. The vapor deposition mask according to claim 1, wherein the second region includes the portion, the second opening part is located more inside than the first opening part, and the second region located at an end of the second opening part does not overlap with the first insulator and the mask body.

4. The vapor deposition mask according to claim 3, wherein the second region includes a step formed inside the main opening part by a part not overlapping with the first insulator and the mask body, a part contacting a side surface of the first opening, and a part contacting an upper surface of the first insulator.

5. The vapor deposition mask according to claim 1, wherein the first region includes the portion, the first opening part is located more inside than the second opening part, and the first region located at an end of the first opening part does not overlap with the second insulator and the mask body.

6. The vapor deposition mask according to claim 5, wherein the first region includes a part not overlapping with the second insulator and the mask body, and a step is formed inside the main opening part by the part and the second region.

7. The vapor deposition mask according to claim 1, wherein the mask body is made of an invar material.

8. The vapor deposition mask according to claim 1, wherein the first insulator and the second insulator are made from an organic material.

9. The vapor deposition mask according to claim 1, wherein the first insulator and the second insulator include silicon oxide or silicon nitride.

10. An organic EL display device comprising a light emitting layer formed using the vapor deposition mask according to claim 1.

11. A vapor deposition mask comprising:
a mask body having a main opening part, a side surface of the main opening part, an upper surface intersecting with the side surface, and a lower surface intersecting with the side surface and opposing the upper surface;
a first insulator contacting the lower surface;
a second insulator contacting the upper surface and the side surface; and
a third insulator contacting the second insulator and opposing the upper surface and the side surface via the second insulator,
wherein
the first insulator includes a first opening part inside the main opening part, and a first region located between the main opening part and the first opening part,
the second insulator includes a second opening part inside the main opening part, and a second region located between the main opening part and the second opening part,
the third insulator includes a third opening part inside the main opening part, and a third region located between the main opening part and the third opening part,
the mask body is sandwiched between the first insulator and the second insulator, and
the third region includes a portion which does not overlap the first region, the second region, and the mask body.

12. The vapor deposition mask according to claim 11, wherein a film thickness of the third insulator is the thinnest among the film thickness of the first insulator, a film thickness of the second insulator and a film thickness of the third insulator.

13. The vapor deposition mask according to claim 11, wherein the third opening part is located furthest inside among the first opening part, the second opening part and the third opening part.

14. The vapor deposition mask according to claim 13, wherein the third region includes a step formed inside the main opening part by a part not overlapping with the first region, the second region, and the mask body, a part contacting a side surface of the first opening part and a side surface of the second opening part, and a part contacting an upper surface of the second region.

15. An organic EL display device comprising a light emitting layer formed using the vapor deposition mask according to claim 11.

* * * * *